United States Patent [19]
Kong

[11] Patent Number: 6,028,453
[45] Date of Patent: Feb. 22, 2000

[54] CHARGE RECYCLING DIFFERENTIAL LOGIC (CRDL) CIRCUIT HAVING TRUE SINGLE-PHASE CLOCKING SCHEME

[75] Inventor: Bai-Sun Kong, Seoul, Rep. of Korea

[73] Assignee: LG Semicon Co., Ltd., Cheongju, Rep. of Korea

[21] Appl. No.: 08/950,973

[22] Filed: Oct. 15, 1997

Related U.S. Application Data

[63] Continuation-in-part of application No. 08/688,881, Jul. 31, 1996, Pat. No. 5,859,548.
[60] Provisional application No. 60/022,565, Jul. 24, 1996.

[51] Int. Cl.[7] .............................................. H03K 19/094
[52] U.S. Cl. .......................................... 326/113; 365/205
[58] Field of Search ............................ 326/113; 365/205, 365/207

[56] References Cited

U.S. PATENT DOCUMENTS

| | | | |
|---|---|---|---|
| 5,378,940 | 1/1995 | Knight, Jr. et al. | 326/21 |
| 5,502,680 | 3/1996 | Du et al. | 365/205 |
| 5,526,314 | 6/1996 | Kumar | 365/207 |
| 5,650,971 | 7/1997 | Longway | 365/207 |

FOREIGN PATENT DOCUMENTS

WO 94/21045 9/1994 WIPO.

OTHER PUBLICATIONS

Kawahara, T., et al., "A Charge Recycle Refresh for Gb–Scale DRAM's in File Applications," IEEE Journal of Solid–State Circuits, Vo. 29, No. 6, Jun. 1994, pp. 715–722.

Younis and Knight, "Practical Implementation of Charge Recovering Asymptotically Zero Power CMOS," Research on Integrated Systems; Proc. 1993 Symp., Cambridge, MA 1993.

H.Y. Huang et al., "True–single phase All–N–logic Differential Logic (TADL) for very high–speed complex VLSI," Proc. IEEE ISCAS, May 1996.

Leilani R. Tamura et al., "A 4–ns BiCMOS Translation–Lookaside Buffer;" Journal of Solid–State Circuits, vol. 25, No. 5, Oct. 1990, pp. 1093–1101.

*Primary Examiner*—David Nelms
*Assistant Examiner*—Hoai Ho
*Attorney, Agent, or Firm*—Fleshner & Kim

[57] ABSTRACT

A novel logic family, called Charge Recycling Differential Logic (CRDL) circuit, reduces power consumption by utilizing a charge recycling technique and has a speed comparable to those of conventional dynamic logic circuits. The CRDL circuit also has improved noise margin due to inherently static operation. An 8-bit Manchester carry chain and full adders were fabricated using a 0.8 μm single-poly double-metal n-well CMOS technology. The measurement results indicate about 16–48% improvements in power-delay product are obtained compared with Differential Cascode Voltage Switch (DCVS) circuit. Further, a circuit operating under a true single-phase clock signal includes a plurality of pipelined stages having a plurality of function blocks to implement a prescribed function. The function blocks are implemented using the novel CRDL circuit. An adder based on the CRDL circuit provided improved performance and reduced power consumption compared to an adder based on the DCVS circuit.

29 Claims, 21 Drawing Sheets

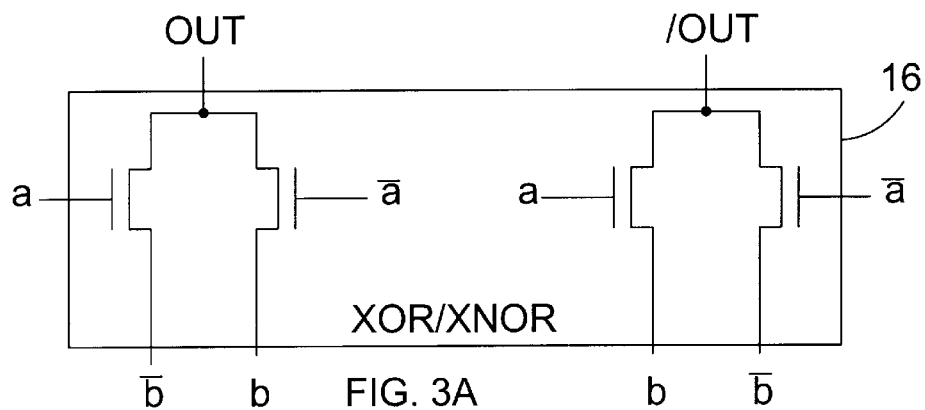
FIG. 3A
| a | b | XOR OUT | XNOR /OUT |
|---|---|---------|-----------|
| 0 | 0 | 0 | 1 |
| 0 | 1 | 1 | 0 |
| 1 | 0 | 1 | 0 |
| 1 | 1 | 0 | 1 |
FIG. 3B
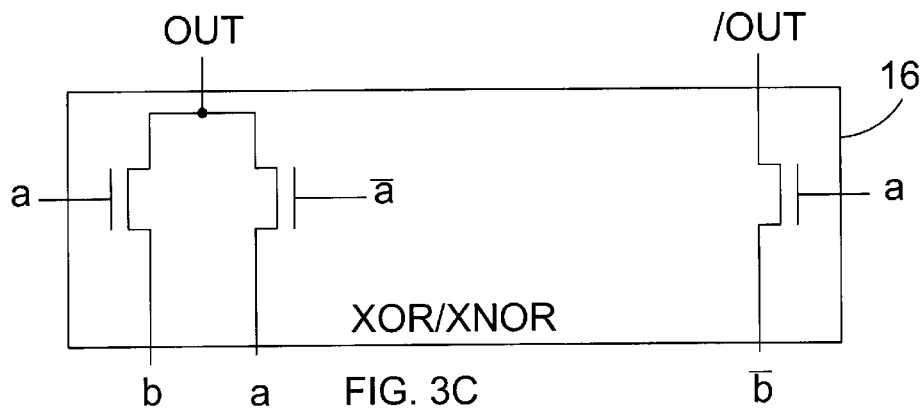
FIG. 3C
| a | b | XOR OUT | XNOR /OUT |
|---|---|---------|-----------|
| 0 | 0 | 0 | 1 |
| 0 | 1 | 0 | 1 |
| 1 | 0 | 0 | 1 |
| 1 | 1 | 1 | 0 |
FIG. 3D

CHARGE RECYCLING DIFFERENTIAL LOGIC (CRDL) CIRCUIT HAVING TRUE SINGLE-PHASE CLOCKING SCHEME

This application is a continuation-in-part application of U.S. application Ser. No. 08/688,881 filed Jul. 31, 1996 U.S. Pat. No. 5,859,548, which claims benefit from U.S. Provisional Serial No. 60/022,565 filed Jul. 24, 1996 under 35 U.S.C. §119(e).

BACKGROUND OF THE INVENTION

1. Field of the Invention

The present invention relates to a novel logic cell, and more particularly, to a storage element or a latch using the novel logic cell.

2. Background of the Related Art

VLSI technology allows the use of powerful hardware for sophisticated computer applications and multimedia capabilities, such as real-time speech recognition and full-motion video. Recent changes in the computing environment have created a variety of high speed electronics applications. However, there is an increased user desire for portability of computational equipment which places severe restrictions on size, weight, and power. Power consumption is a major consideration in mobile applications since a number of portable applications require low-power and high-throughput simultaneously. For example, notebook and laptop computers require almost the same computational speed and capabilities as desktop machines. Equally demanding are developments in Personal Communications Services (PCS's) such as the digital cellular telephony networks which employ complex speech compression algorithms and sophisticated radio modems.

Further, more power is required for the portable multimedia systems supporting full-motion digital video. Power for video compression and decompression and speech recognition is required on top of the already lean power budget. These portable systems have increased capabilities compared to fixed workstations and are required to operate in a low power portable environment.

Even in non-portable systems, low power consumption is becoming more important. Until recently, power consumption has not been a great concern since the heat generated on-chip can be sufficiently dissipated using a proper package. However, the reduction in the minimum feature size allows implementation of more functional units in a single chip by increasing the number of integrated transistors.

These functional units are usually computation-intensive and operate concurrently. Power consumption increases dramatically in complex VLSI systems such as high performance microprocessors and general-purpose digital signal processors (DSP's). Since the power dissipated in a CMOS digital circuit is proportional to the clock frequency, higher operational speed further increases power consumption.

Further, some adequate cooling techniques, such as using fins and fans, are required to handle increased internal heat. Such techniques increase cost and/or limit the amount of functionalities which can be integrated in a single chip. Hence, reducing power consumption has become a critical concern for designing complex VLSI systems.

There are a variety of considerations that must be taken into account for low power design which include the style of logic used, the technology incorporated, and the architecture employed. Among these, choosing a proper logic style is an important factor for low power since the power consumed in the arithmetic and logical units is greatly dependent on the way in which these blocks are implemented. The logic circuit choice also affects the architectural selection. Hence, there is a need for full exploitation of existing logic circuits to optimize and create a new logic circuit for low power operation.

There are a number of options available in choosing the basic circuit approach and topology of implementing various logic and arithmetic functions. In general, logic families can be divided into two broad categories, depending on the type of operation. The first category is a static logic circuit including standard CMOS logic and pass-transistor logic in which all the internal nodes are static, and thus noise margin is high. The second category is a dynamic logic circuit which uses a precharge technique to improve speed performance. However, the cost increases due to higher design complexity in order to eliminate the problems such as charge sharing due to dynamic operation. U.S. application Ser. No. 08/688,881, which is commonly assigned to the same assignee of this application, describes and illustrates the numerous problems of different static and dynamic logic circuits. The disclosure of U.S. application Ser. No. 08/688,881 is incorporated herein by reference.

Although the conventional logic circuits attempt to reduce the amount of charge consumed in each cycle, power consumption is large, since the charge is repeatly moved from the supply voltage to the ground voltage within a given cycle. Younis and Knight at MIT proposed a method of charge recovering via a new logic family, called Charge Recovering Logic (CRL), which was described in the articles entitled "Practical Implementation of Charge Recycling Asymptotically Zero Power CMOS," Research on integrated systems; Proc. 1993 Symp., Cambridge, Mass. 1993.

The charge recovery technique can achieve energy saving of over 99% when the devices are switched sufficiently slowly. The concept is to create a mirror image of a circuit that computes the inverse of the original, as shown in FIG. 1A. As each stage in the circuit finds an answer, it passes the result on to its mirror image which computes the inverse. In the main circuit, charge moves toward the end, while charge is recycled back to the beginning in the mirror circuit. However, the logic design for implementing the CRL is quite impractical and the anticipated power saving is nearly impossible to be realized in ordinary applications.

Succeeding refinements for saving and reusing only a fraction of the charge seem to be compatible with conventional CMOS technology. An example is a Reduced-Power Buffer (RPB), illustrated in FIG. 1B, which uses storage capacitor to save some of the charges otherwise being dissipated. This circuit includes a driver with an additional storage capacitor attached to the output node through a switch TI. During a high-to-low transition, the circuit saves some of the charge into the storage capacitor Cs, instead of dissipation to the ground. Just before the next low-to-high transition, the saved charge is recycled to the output node.

This scheme is only useful to the applications dominated by switching of large capacitive loads and the storage capacitor must be larger than the load capacitor to obtain sufficient power savings. Another example is a refresh scheme in DRAM to recycle the charge used to refresh cells in one array for use in the other array, which is described in an article entitled "A charge Recycle Refresh for Gb-Scale DRAM's in File Applications," IEEE Journal of Solid State Circuits, Vol. 29, No. 6, June 1994, by Kawahara et al. However, there is no practical charge recycling scheme for general use in logic circuit design.

Synchronous design approaches, which are popularly used in current VLSI design, rely on the clock to synchronize function blocks and storage elements. An efficient clock scheme is always important for designing high performance systems. Currently, there are a variety of different clocking schemes according to several different types of storage elements and logic families.

One of the most popular clocking strategies is a non-overlapping pseudo two-phase clocking scheme which is implemented with a Clocked CMOS ($C^2$MOS) latch. The circuit diagram and the clock waveform of this clocking scheme are shown in FIGS. 1C and 1D. The clocking scheme consists of two pairs of clock phases, and in each pair there are two signals which are inverting and noninverting. Thus, up to four clock signals CK1, /CK1, CK2 and /CK2 have to be distributed for routing; a possible skew between these phases can cause serious problems. A great deal of design effort is required to prevent race problems due to the clock skew. A non-overlapping period is introduced as a margin to prevent the skew problems. This non-overlapping period does not contribute to operation time and remains as a dead time which causes a difficulty in increasing clock speed. Moreover, the distribution of multiple clocks uniformly throughout a system increases the design costs, especially in high-speed applications.

The NORA dynamic CMOS technique uses a true two-phase clock signals CK and /CK, instead of using the pseudo two-phase clock signal. The logic structure and the associated clock waveforms are shown in FIGS. 1E and 1F. It can avoid race problems caused by clock skews with some constraints on logic composition. The most important constraint is that between two $C^2$MOS latches there must be an even number of inversion blocks. If there are static blocks between a precharge block and a $C^2$MOS latch, they must also be of an even number.

The true single-phase clock dynamic CMOS circuit technique, which is shown in FIG. 1G, uses only one clock signal CK. No clock skew exists except for clock delay problems and even a higher clock frequency can be realized with no constraint on logic implementation of the NORA technique. However, this circuit requires a PMOS logic block (p-section) which may cause a speed degradation of the entire system. To solve this problem, a True-single-phase All-N-logic Differential Logic (TADL) has been proposed to use only NMOS-logic blocks in a pipeline configuration by H. Y. Huang et al. in an article entitled "True-single-phase All-N-logic Differential Logic (TADL) for very high-speed complex VLSI," in Proc. IEEE ISCAS, May 1996. However, the proposed circuit merely changes PMOS transistors in the logic network with NMOS transistors to drive logic "high" value. Hence, the speed improvement is not as high as expected. Moreover, all the functionalities in a pipeline section using the TADL technique must be implemented in one stage, which may decrease the logic flexibility.

The above references are incorporated by reference herein where appropriate for appropriate teachings of additional or alternative details, features and/or technical background.

SUMMARY OF THE INVENTION

An advantage of the present invention is in decreasing the power consumption of a logic circuit.

Another advantage of the present invention is in increasing the speed of a logic circuit.

A further advantage of the present invention is in reducing the di/dt noise of a logic circuit.

Still another advantage of the present invention is in eliminating the noise sensitive dynamic nodes of a logic circuit.

Still a further advantage of the present invention is in easily implementing any logic function.

A further object of the invention is to provide a circuit with a true single-phase clocking scheme.

The present invention is achieved at least in parts or in a whole by a circuit operating under a true-single phase clock signal of first and second levels, comprising a plurality of pipelined stages to perform an arithmetic function, each pipelined stage preforming a prescribed function and having a plurality of function blocks to implement the prescribed function, each of the function block having a logic circuit including a) first and second nodes; b) means for pulling-up the first node to a first potential when the clock signal transits from the first level to the second level; c) means for pulling-down the second node to a second potential when the clock signal transits from the first level to the second level; and d) means for equalizing the first and second nodes to a third potential between the first and second potentials when the clock signal transits from the second level to the first level.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 3A and 3B illustrate the pass transistor logic network for implementing the XOR/XNOR logic function and the logic table, respectively;

FIGS. 3C and 3D illustrate the pass transistor logic network for implementing the AND/NAND logic function and the logic table, respectively;

DETAILED DESCRIPTION OF PREFERRED EMBODIMENTS

The choice of a logic style for implementing the logic functions depends on many criteria, such as speed, power, testability, and ease of design. To reduce power consumption, factors such as the supply voltage, parasitic capacitance, switching activity of operation, short-circuit current, ease of applying power-down mode, etc., are major considerations. The speed is also an important consideration because power consumption is affected by the energy required to do a given operation.

Figure 1A:
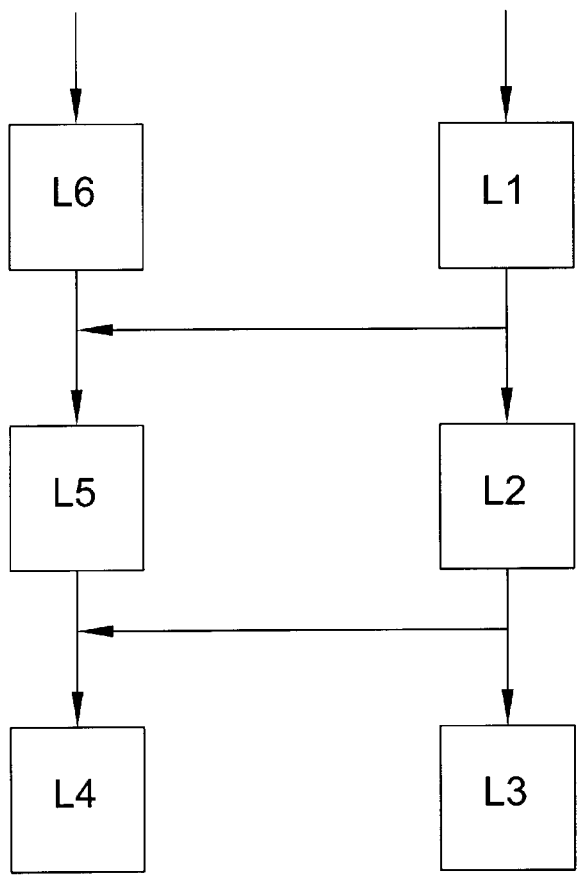
FIG. 1A illustrates the concept of the charge recovering technique.
Figure 1B:
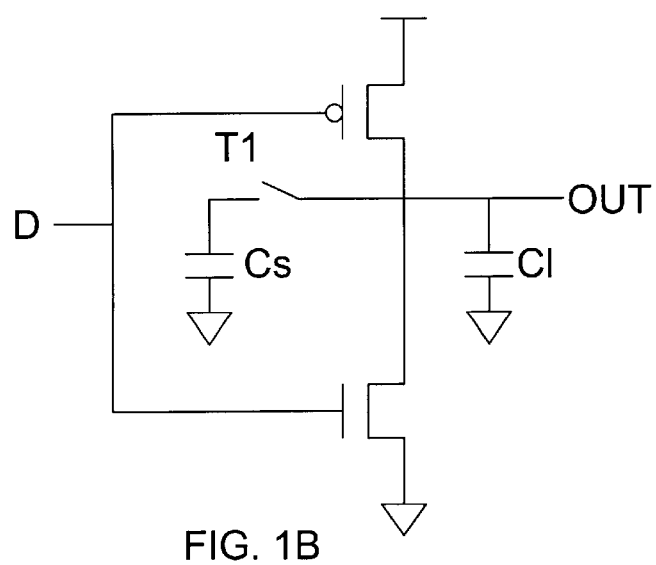
FIG. 1B is a simplified transistor-level schematic of a reduced power buffer.
Figure 1C:
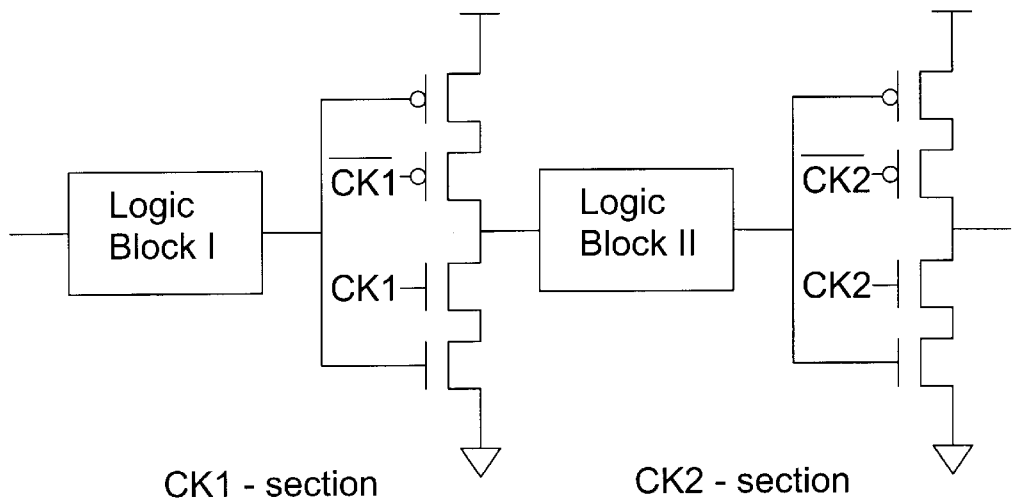
FIGS. 1C and 1D are the circuit diagram and clock waveform, respectively, of a non-overlapping pseudo two-phase clocking scheme.
Figure 1D:
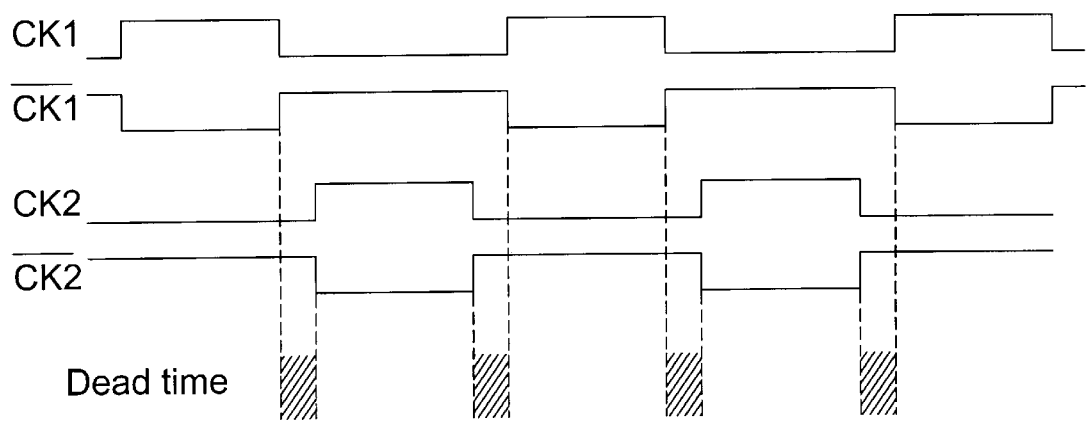
Figure 1E:
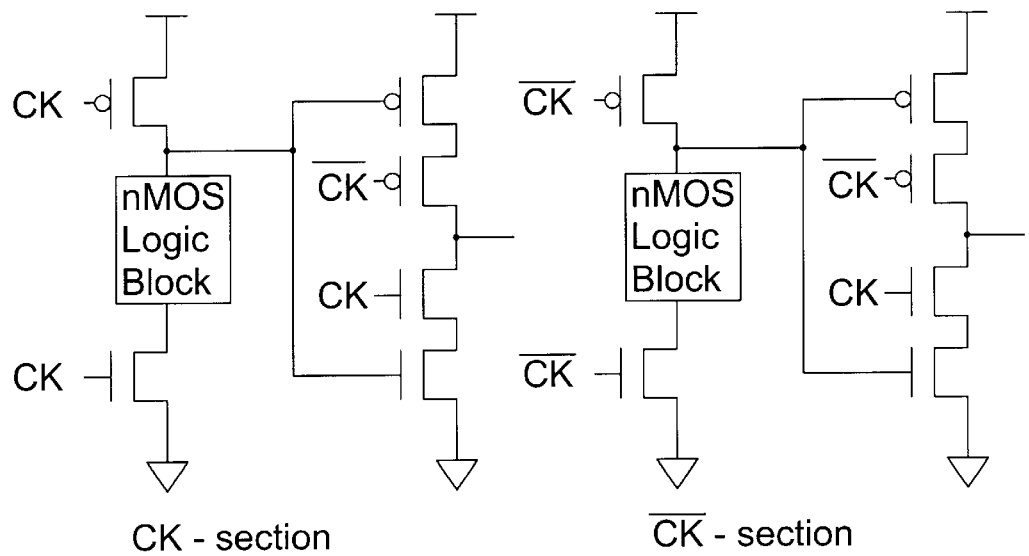
FIGS. 1E and 1F are the circuit diagram and clock waveform, respectively, of a true two-phase clocking scheme using NORA dynamic CMOS technique.
Figure 1F:
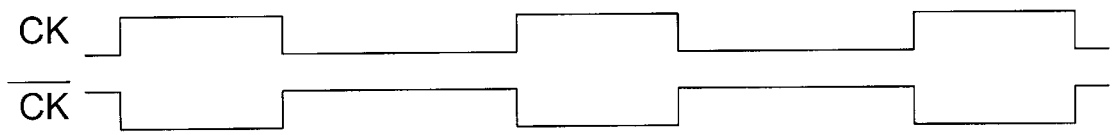
Figure 1G:
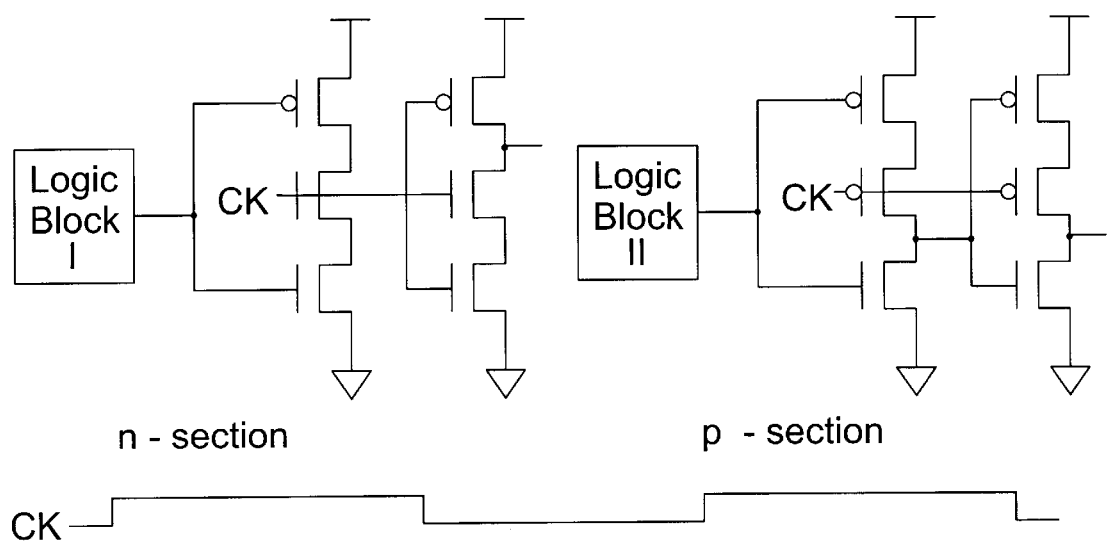
FIG. 1G illustrates a true single-phase clock dynamic CMOS circuit technique.
Figure 2A:
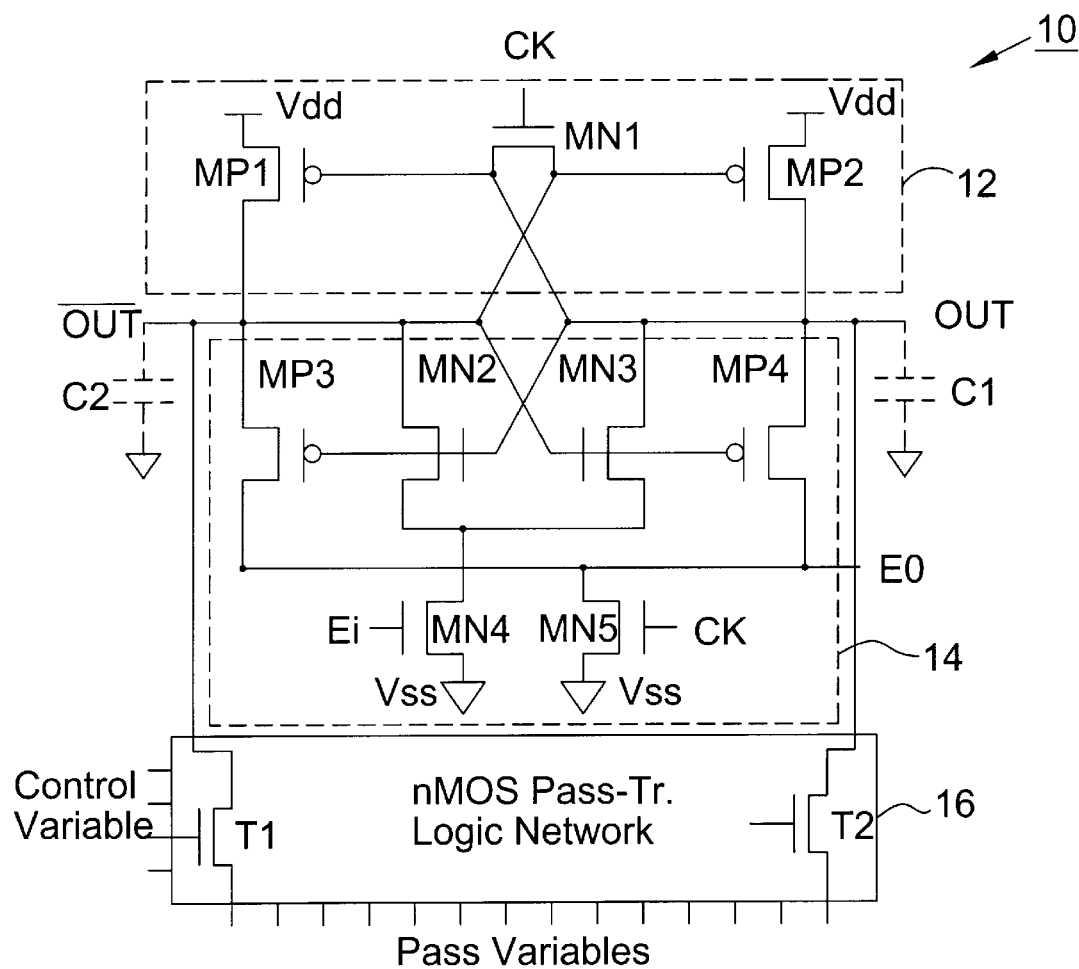
FIG. 2A is schematic of a Charge Recovery Differential Logic (CRDL) circuit in accordance with an embodiment of the present invention.

FIG. 2A illustrates a generic Charge Recycling Differential Logic (CRDL) circuit 10 in accordance with the present invention. The CRDL includes a complementary output pass-transistor logic network 16 with a precharging circuitry 12, and an acceleration buffer 14. There are generally two types of inputs to the pass-transistor logic network: (1) control variables and (2) pass variables to implement a particular logic function.

The precharging circuitry 12 includes a cross-coupled pair of the pMOS transistors MP1 and MP2 connected to the output nodes /OUT and OUT, respectively, and an nMOS transistor MN1 connected to the gates of transistors MP1 and MP2. The cross-coupled pair MP1 and MP2 pulls one of the complementary output nodes /OUT or OUT up to a source voltage Vdd as the other goes down to a ground voltage Vss, while the nMOS transistor MN1 is used to equalize the voltages of the output nodes OUT and /OUT to about half the supply voltage Vdd. The threshold voltages of the pMOS transistors MP1 and MP2 in the cross-coupled pair are relatively higher than other transistors. In other words, the pMOS transistors MP1 and MP2 are nearly off when the two complementary output nodes OUT and /OUT are precharged to half Vdd. The capacitors C1 and C2 are parasitic capacitances of the output nodes OUT and /OUT, respectively. The parasitic capacitances may or may not be equal to each other.

The nMOS pass transistor logic network 16 operates faster than a cascode logic network. However, when used in a long chain of a buffer, the speed of the CRDL circuit 10 may be degraded. The acceleration buffer 14 may be added to increase the operational speed of the CRDL circuit 10. The acceleration buffer 14 is activated by an enable signal Ei, and the signal Eo is the output signal for use as the enable signal Ei in the next stage. The transistors MN2, MN3, and MN4 form the sense amplifier to accelerate a pull-down transition, and transistors MP3, MP4, and MN5 are used to generate the enable signal for the amplifier in the next stage. The enable signal Ei disables the transistor MN4 in the precharge phase and enables the transistor MN4 in a self-timed manner during the evaluation phase to accelerate the pull-down transitions of output nodes OUT and /OUT.

The CRDL circuit 10 preferably has two phases of operation, i.e., a precharge phase and an evaluation phase. During the precharge phase, the clock signal CK goes high, connecting the two output nodes OUT and /OUT through the nMOS transistor MN1. By the charge sharing effect, the voltage levels of both output nodes OUT and /OUT become substantially equal. Since the outputs are complementary, the output nodes OUT and /OUT reach a voltage level in-between Vdd and Vss. Generally, the output nodes OUT and /OUT reach ½(Vdd−Vss) if the voltage applied to the logic is source and ground voltage. Assuming that the parasitic capacitance of each node is comparable, the voltage of the output nodes reach about half Vdd. If not, the pMOS transistors in the cross-coupled pair turn on, and supply an additional charge to the precharge nodes making the voltage closer to half Vdd. After reaching the required voltage level, output nodes experience no subsequent pull-up because the cross-coupled pMOS transistors MP1 and MP2, having higher threshold voltages, turn off immediately.

In the evaluation phase, the clock signal CK goes low such that the transistor MN1 turns off to separate the precharged nodes OUT and /OUT from each other. Depending on the applied input values, a low impedance path to ground is established at one of the two precharged nodes through the pass-transistor network 16, pulling down the node toward ground. For example, if the output node /OUT is to be evaluated low, the lowering of the voltage level at this node turns on the pMOS transistor MP2 in the cross-coupled pair pulling up the output node OUT. When the enable input signal Ei goes high, the transistor MN4 is turned on to activate the sense amplifier. Through the regenerative action of the sense amplifier, the output node /OUT is pulled down quickly toward ground. As the voltage difference between the output nodes OUT and /OUT becomes larger, the transistor MP4 in the acceleration buffer turns on to generate the output Eo which is to be used for activating the sense amplifier in the next stage.

As described above, the acceleration buffer is used to increase the speed of the CRDL circuit and is not necessarily required in the CRDL circuit. However, when used, the timing of the output signal Eo from the previous stage should meet certain constraints for reliable operations. For speed, a faster Ei signal is preferable to achieve a higher performance. However, if the sense amplifier is enabled too fast, the amplifier may not sense the logic states correctly leading to false output values. Thus, the enable signal Ei should be enabled after a sufficient voltage difference between the output nodes OUT and /OUT.

For reliable operation, the output signal Eo of the previous stage is preferably used as the enable signal Ei for the current stage. Assuming no timing constraint is violated, the enable signal Ei for the current stage can be applied from the 2nd or 3rd previous stages, instead of the 1st previous stage to achieve the highest possible speed. If the output signal Eo from the previous stage cannot meet certain timing constraints, the propagation delay can be adjusted by changing the size of the transistors in the acceleration buffer 14, by inserting a proper delay element, etc.

Figure 2B:
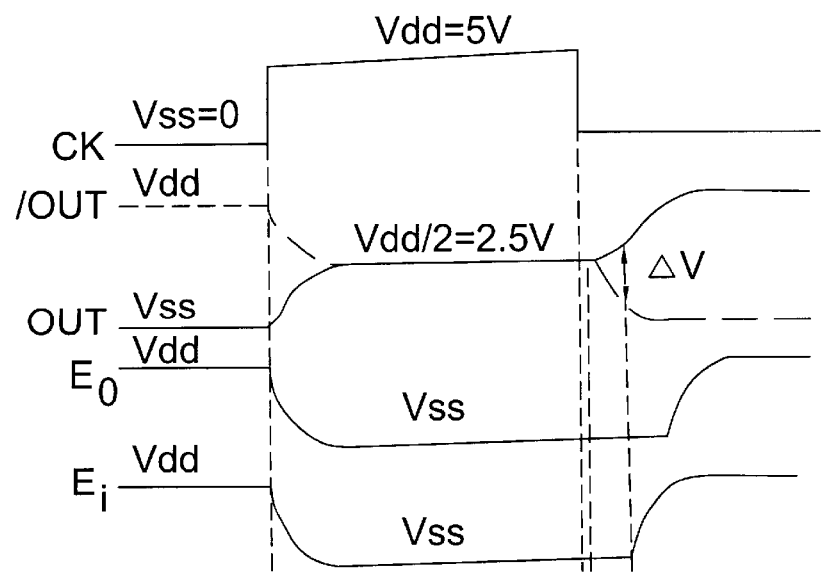
FIG. 2B is an operational timing diagram of the CRDL circuit illustrated in FIG. 2A.

With reference to FIG. 2B, the operation of the CRDL circuit 10 of FIG. 2A is as follows, assuming Vdd is about 5V and the nMOS pass transistor logic network 16 comprises nMOS transistors T1 and T2, the gate and drain of each transistor is coupled to the control variables and pass variables, respectively. The control and pass variables may be connected to the output nodes of a previous stage.

When the clock signal CK is low, the CRDL circuit is in an evaluation phase. During this phase, the transistor MN1 is off, and the output nodes OUT and /OUT are separated from each other. The potential of OUT and /OUT are 0V (e.g., low) and 5V (e.g., high), respectively. The enable signal Ei and the output signal Eo are both at about 5V or high.

When the clock signal CK changes to a low signal, the CRDL circuit 10 operates in a precharge phase. The transistor MN1 is turned on, and the output nodes OUT and /OUT are connected to each other. Hence, the charge stored in the parasitic capacitor C2 of the output node /OUT is shared with the parasitic capacitor C1 of the output node OUT until the potential at each node reaches about half Vdd, i.e., 2.5V. During the precharge phase, the transistors MP3, MN2, MN3, MP4, MN4 and MN5 are all off, and the enable signal Ei and the output signal Eo drop to 0V or low.

When the clock signal changes to a low signal, the voltage applied to the gate and drain of the transistor T1 increases to 5V and decreases to 0V, respectively, while the voltage applied to the gate and drain of the transistor T2 decreases to 0V and increases to 5V, respectively. Hence, the transistors T1 and T2 are turned on and off, respectively. Since current flows through the transistor T1, the potential at the output node /OUT goes down to 0V, causing transistor MP2 to be turned on. A current flow through the transistor MP2 increases the potential at the output node OUT to 5V or high.

As shown, the pull down of the output node /OUT is faster than the pull up of the output node OUT. For reliable operation, the enable signal Ei should be applied when there is a certain voltage deviation ΔV between the output nodes OUT and /OUT. When the enable signal Ei of 5V is applied, the transistor MN4 is turned on. The transistor MN5 is turned off due to a clock signal of a low level. Since the gates of transistors MP3 and MN2 are coupled to the output node OUT, the transistors MP3 and MN2 are turned off and on, respectively. Similarly, since the potential at the output node /OUT decreases to 0V, the transistors MN3 and MP4 are turned off and on, respectively. As a result, the pull down operation is accelerated, and the output signal Ei of high is generated. As shown in FIG. 2B, there is a timing difference between the enable signal Ei and the output signal Eo.

As illustrated above, the transistor MN1 functions as an equalization transistor to allow the sharing of charges between the parasitic capacitances of the output nodes OUT and /OUT. The cross-coupled pair of transistors MP1 and MP2 allows precise precharge level of about ½(Vdd−Vt), where Vt is the threshold voltage of the transistors MP1 and MP2 during the precharge phase. During the evaluation phase, the transistors MP1 and MP2 supply current for a pull-up function. The pull-down function is accomplished by the nMOS pass transistor logic network 16.

As discussed above, the threshold voltages of transistors MP1 and MP2 are relatively higher than the other transistors. To adjust the threshold voltage, an extra implantation process can be carried out. However, such an additional process step may be too costly. As known to one of ordinary skill in the art, back bias or other techniques can be used to control the threshold voltage of the transistors MP1 and MP2 to be higher than the precharge level at the output nodes OUT and /OUT.

FIGS. 2C–2G illustrate different embodiments of the CRDL circuit. In the FIG. 2C embodiment, the transistors MN1, MP3, MP4, and MN5 of the FIG. 2A embodiment are replaced by the transistors MP3, MN1, MN5 and MP4, respectively, such that the CRDL circuit 10 operates in the precharge and evaluation phases when the clock signal is at low and high levels, respectively. The FIGS. 2D and 2E embodiments are similar to the FIGS. 2A and 2C embodiments. Instead of using an nMOS pass transistor logic network 16, the CRDL circuit of FIG. 2D uses an nMOS cascode logic networks 16'. Since there is no speed degradation in a cascode logic tree, the transistors MN2, MN3, and MN4 of FIG. 2A embodiment are eliminated and an inverter INV and a transistor MP5 are added in the FIG. 2D embodiment.

Figure 2C:
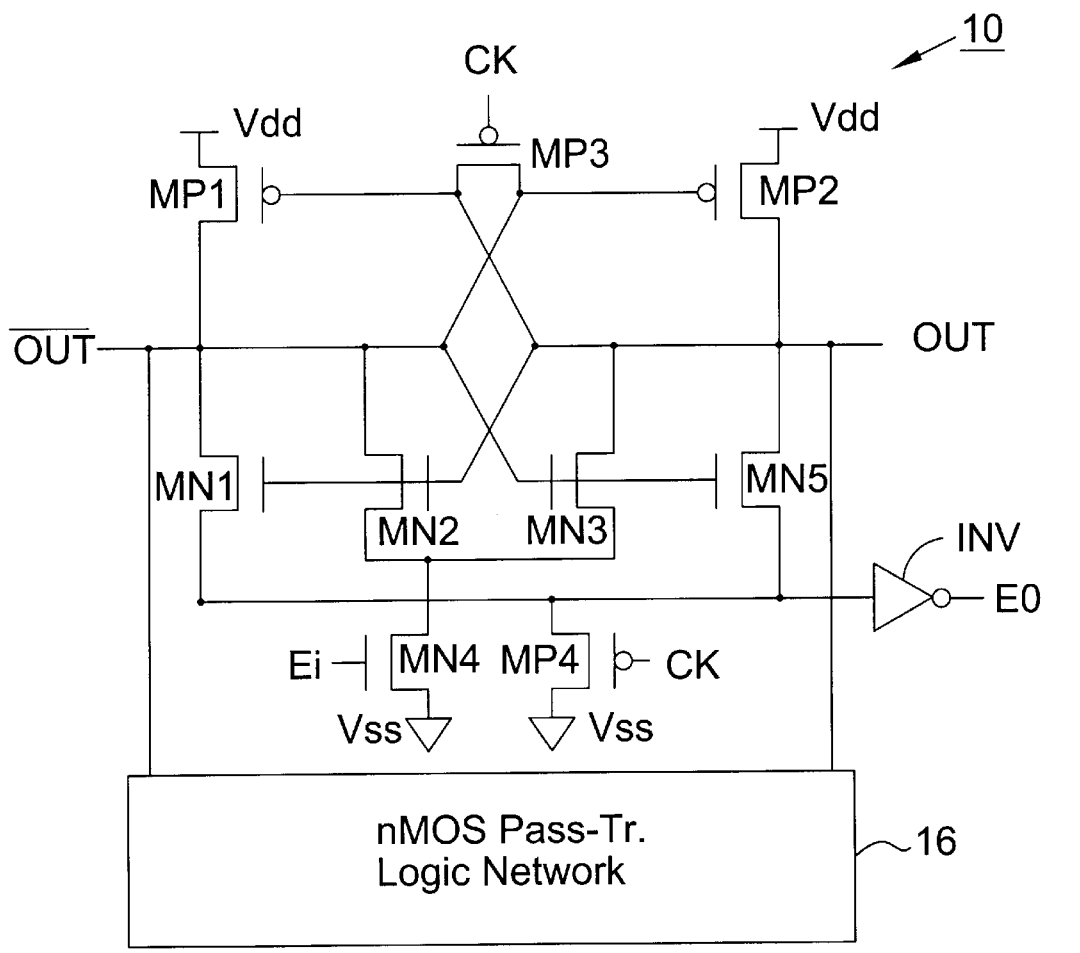
FIGS. 2C–2G are schematics of different embodiments of the CRDL circuit.
Figure 2D:
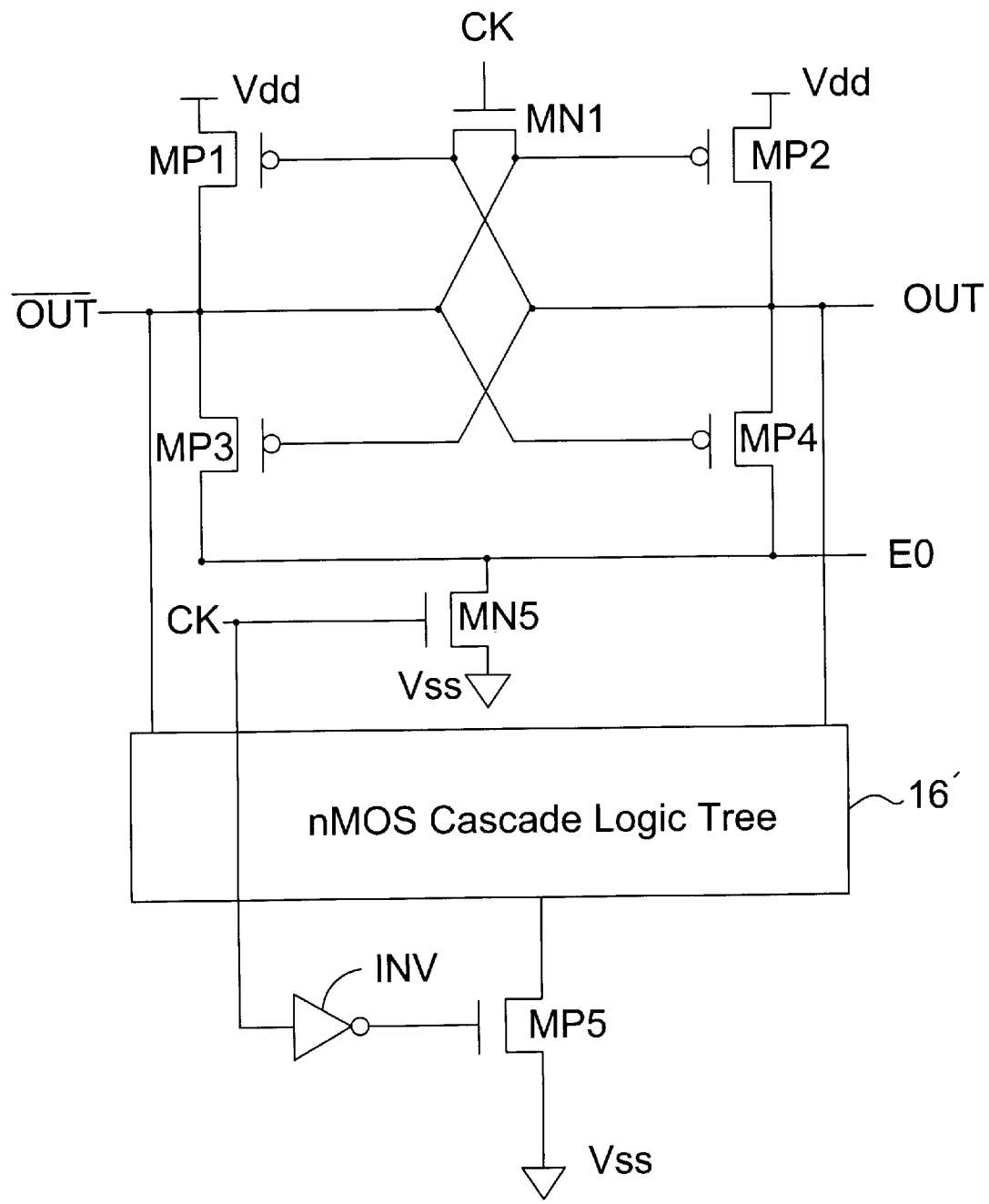
Figure 2E:
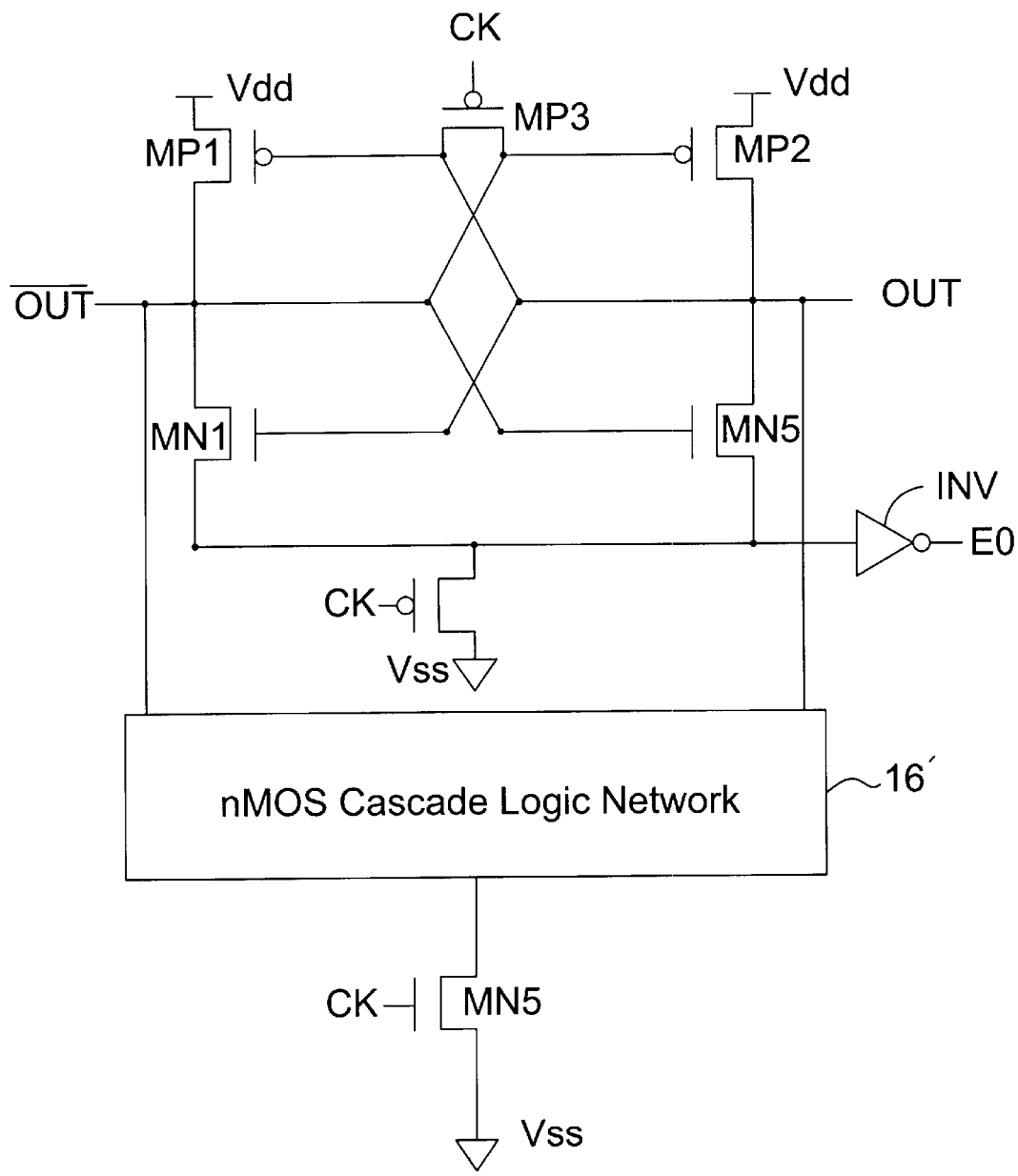
Figure 2F:
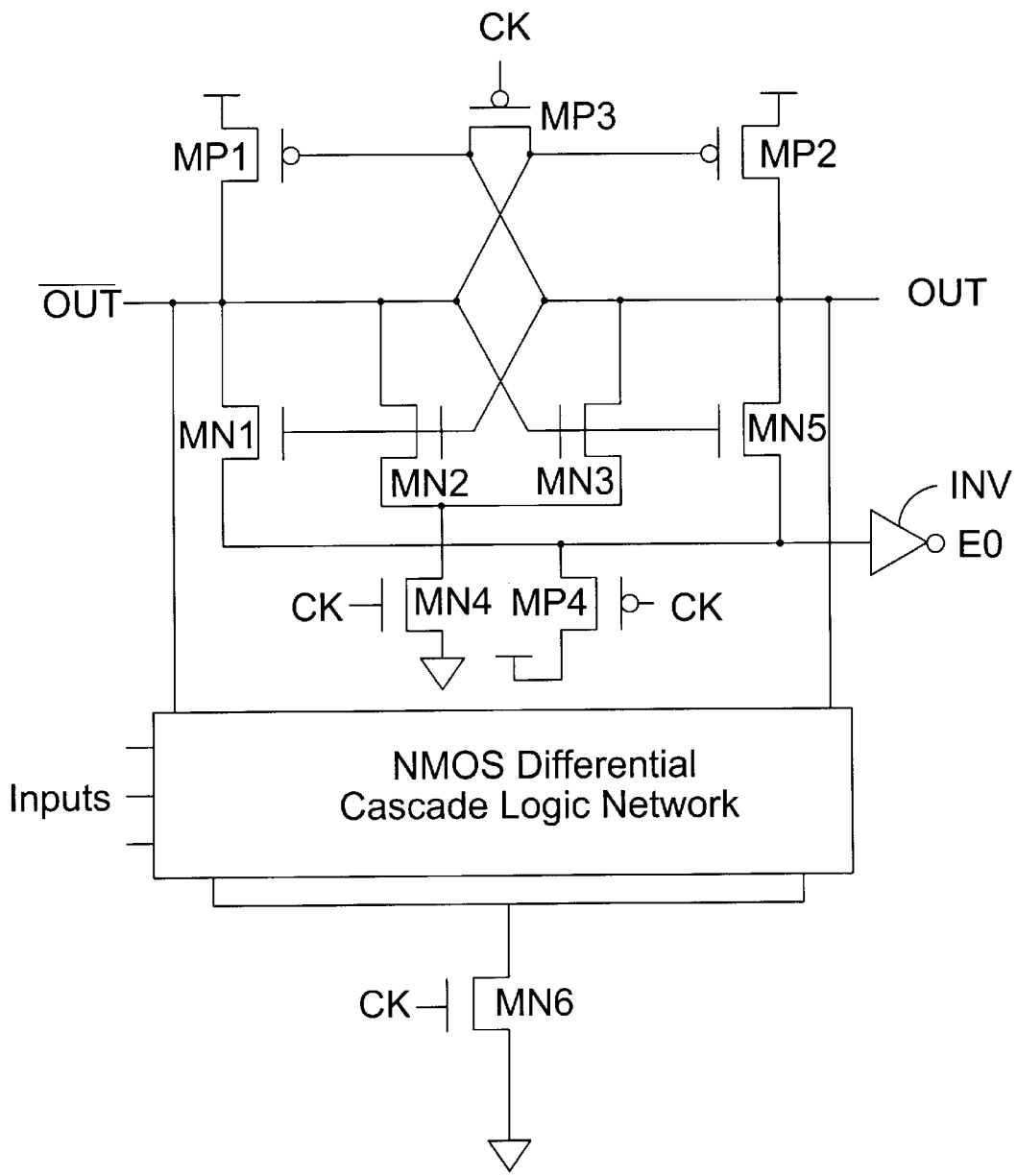
Figure 2G:
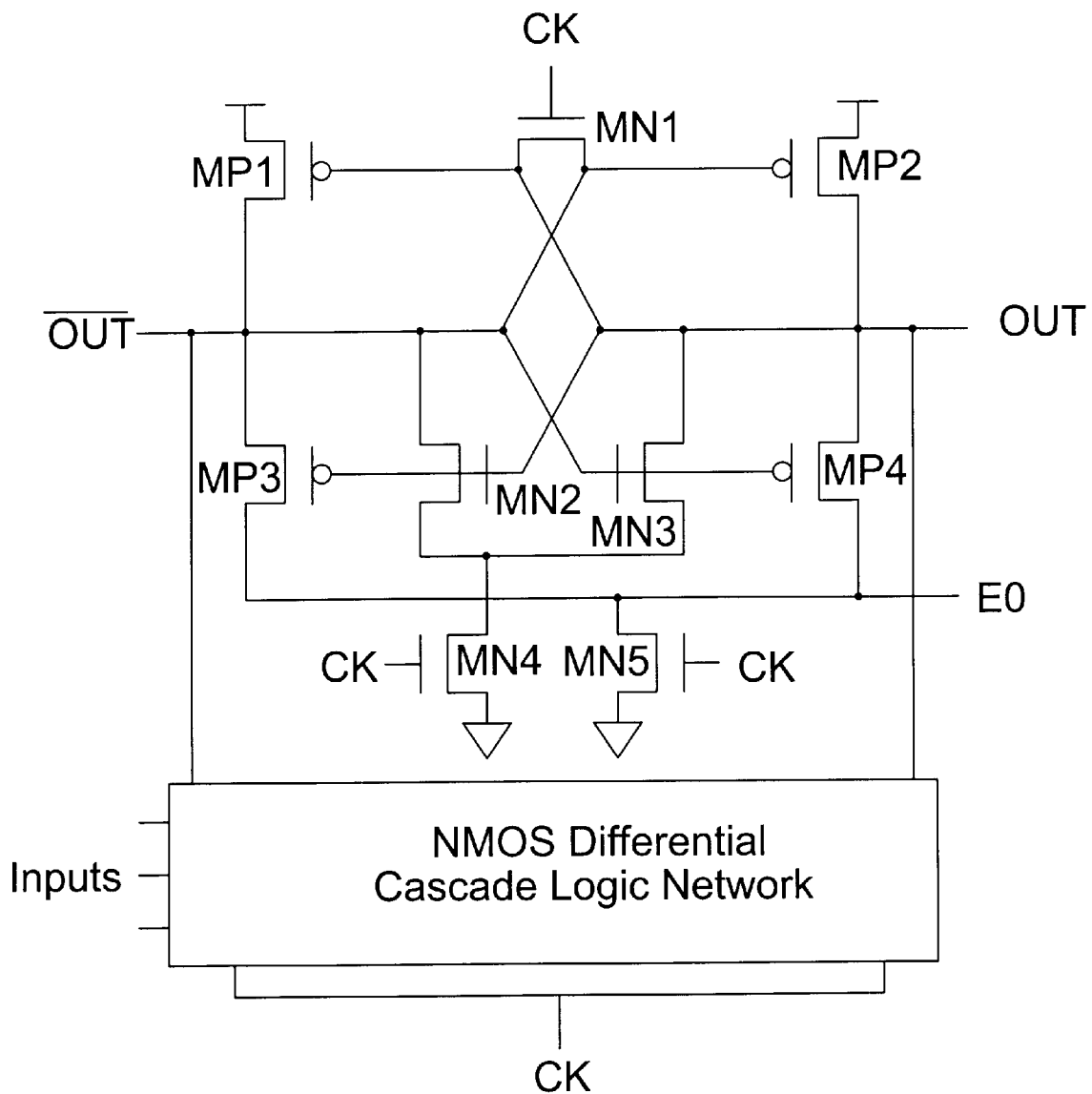

Similarly, the CRDL circuit of FIG. 2E uses an nMOS cascode logic tree 16' and the transistors MN2, MN3 and MN4 of FIG. 2C are eliminated and an inverter INV and a transistor MN5 are added in the FIG. 2E embodiment. The transistors MP5 and MN5 of the FIGS. 2D and 2E embodiments prevent a leakage current of the nMOS cascode logic network. The CRDL circuit of FIG. 2F is similar to the CRDL circuit of FIG. 2C. In FIG. 2F, a cascode logic network is used with a transistor MN6 driven by the clock signal instead of the differential pass-transistor logic network. The FIG. 2G embodiment is similar to the FIG. 2A embodiment, but uses a cascode logic network is used with the clock signal directly connected to the sources of the bottom devices in the logic network. Based on the operational description of the FIG. 2A embodiment, the operation of the FIGS. 2C–2G is apparent to one of ordinary skill in the art and the description thereof is omitted for simplicity.

As described above, the potential at the output nodes OUT and /OUT goes from Vdd to ½(Vdd) to Vss or vice versa. Unlike the present invention, most conventional CMOS circuits require full voltage swing from Vdd to Vss or vice versa. Hence, the output nodes OUT and OUT require an interface to change the voltage swing level for use with conventional full swing logic circuits. The interface circuits are disclosed in U.S. application Ser. No. 08/688,881, and such disclosure is incorporated herein by reference.

The CRDL circuit has several important advantages over conventional dynamic logic circuits. The CRDL circuit uses a novel precharge scheme in which the charge used for the logic evaluation in a first cycle is recycled to establish a precharge value in the second subsequent cycle. Hence, the CRDL consumes less power than the conventional full-swing precharge circuits. In ideal situations, assuming that precise half-supply precharge level is achieved, the amount of power consumed by the CRDL circuit is about 50% less than a full-swing circuit.

The charge recycling operation also reduces di/dt noise on the supply lines, which sometimes a critical problem in conventional circuits. The CRDL circuit uses internally stored charge to precharge the output nodes during the precharge phase, resulting in a reduction in the amount of the current from the supply. Noise during the evaluation phase also decreases due to reduced voltage swing, resulting in smaller current to and from the supply lines.

Further, there is no noise-sensitive dynamic nodes in the gates. Although the operation of the CRDL circuit is based on the precharge and evaluation actions using a clock, all of the evaluated nodes are connected to either supply or ground rails leading to a static operation. Hence, the problems related to a dynamic node, such as degraded noise margin, are eliminated.

The CRDL circuit also has the advantages of the pass-transistor logic network to implement any random Boolean function. For example, XOR's can be implemented using only two pass-transistors. In the CRDL circuit, the devices needed for the pull-up function in the pass-transistor network can be eliminated since the cross-coupled transistors in the precharge circuitry perform such a function. Such an efficient implementation is particularly important since the key to reducing power dissipation and increasing speed of logic circuits is the reduction of the number of devices.

FIGS. 3A and 3C illustrate the nMOS pass transistor logic network to implement the Boolean function of XOR/XNOR and AND/NAND gates. As shown in the logic table of FIG. 3B, the XOR function is accomplished by two pass transistors coupled to the output node OUT, and the XNOR function is accomplished by two pass transistors coupled to the output node /OUT. Similarly, as shown in the logic table of FIG. 3D, the AND function is accomplished by two pass transistors coupled to the output node OUT, and the NAND is accomplished by a pass transistor coupled to the output node /OUT.

Figure 4A:
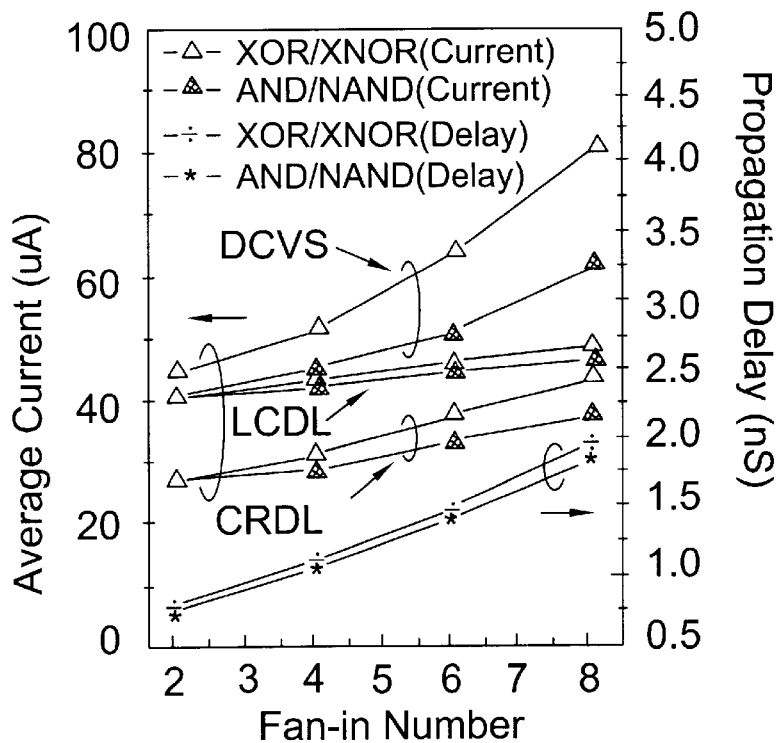
FIG. 4A illustrates comparison results of current consumption for XOR/XNOR and AND/NAND gates using DCVS, LCDL, and CRDL circuits.
Figure 4B:
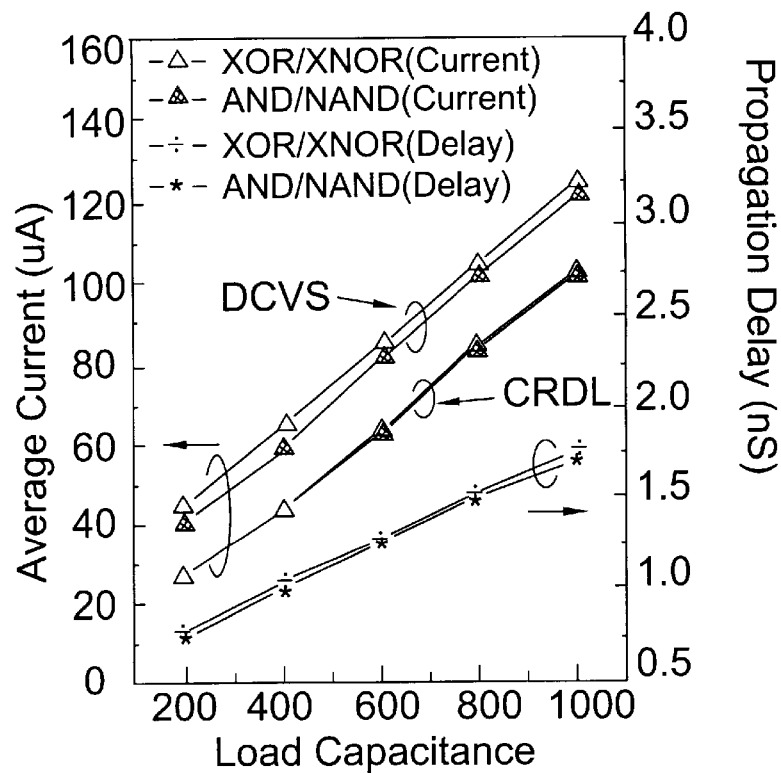
FIG. 4B illustrates current consumption of two input XOR/XNOR and AND/NAND gates using DCVS and CRDL circuits with changing load capacitance.

To verify the performance of the CRDL circuit, the current drawn from the supply rail is compared with those of the conventional logic types, such as DCVS and LCDL. The comparisons were done at a power supply of 5V using HSPICE for several fan-in numbers and load capacitance values. FIG. 4A plots the current consumption of the XOR/XNOR and the AND/NAND gates implemented in each logic circuit with the fan-in number being changed from 2 to 8 at a load capacitance of 100 fF. FIG. 4B shows the same data with the load capacitance is changed over the range of 0.2–1 pF.

The propagation delays of all the logic styles for each Boolean function are made to be the same by device sizing for each fan-in number and load capacitance value, and are shown in the respective figure. From these figures, the CRDL circuit has the smallest current consumption among all the logic circuits, indicating that this logic type consumes the least amount of power.

Figure 5:
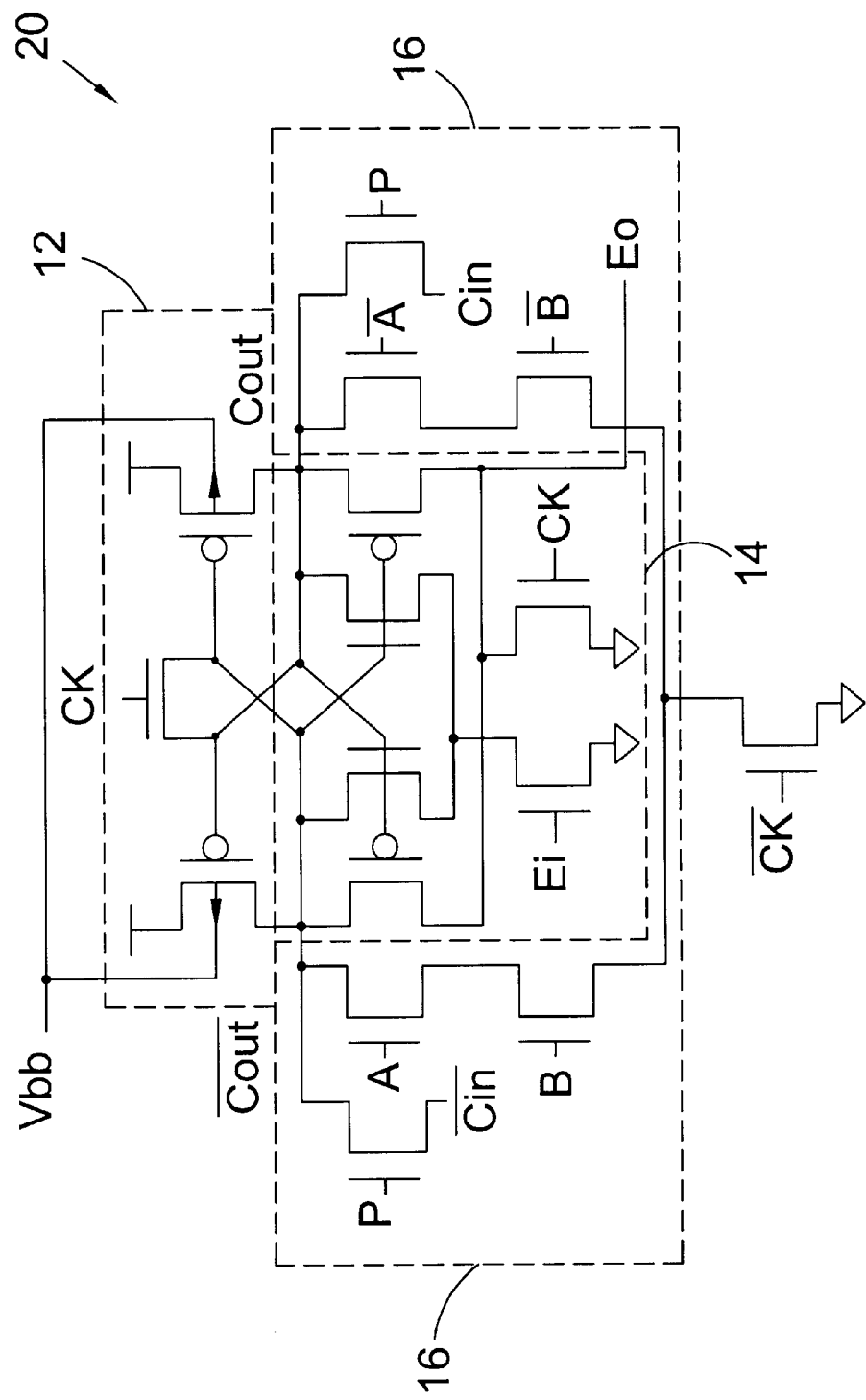
FIG. 5 is a schematic diagram of a Manchester carry-chain using the CRDL circuit.

FIG. 5 depicts a schematic diagram of a bit-sliced cell 20 of a Manchester carry-chain circuit. The cell 20 includes a precharging circuit 12, where the threshold voltage of the cross-coupled pMOS transistors is adjusted by a substrate bias Vbb, and an acceleration buffer 14. The output nodes serve as carry output nodes Cout and /Cout of the cell 20. As shown, the logic network 16 allows simple implementation to accomplish the bit-sliced cell 20 using nMOS transistors controlled by control and pass variables A, /A, B, /B and P and carry-in signals Cin and /Cin.

Figure 6A:
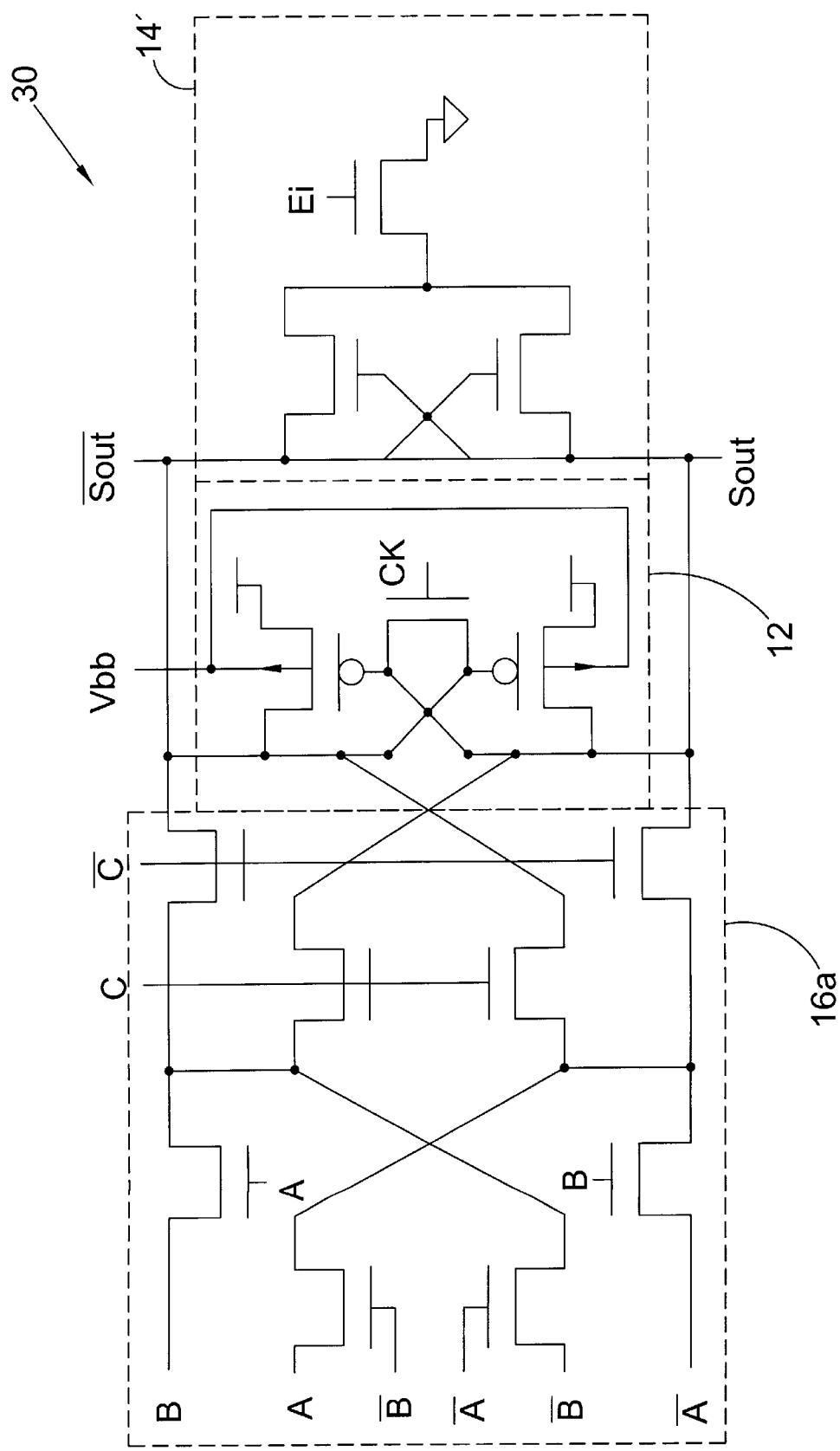
FIGS. 6A and 6B illustrate schematic diagrams of sum and carry circuits, respectively, of a full adder using the CRDL circuit.
Figure 6B:
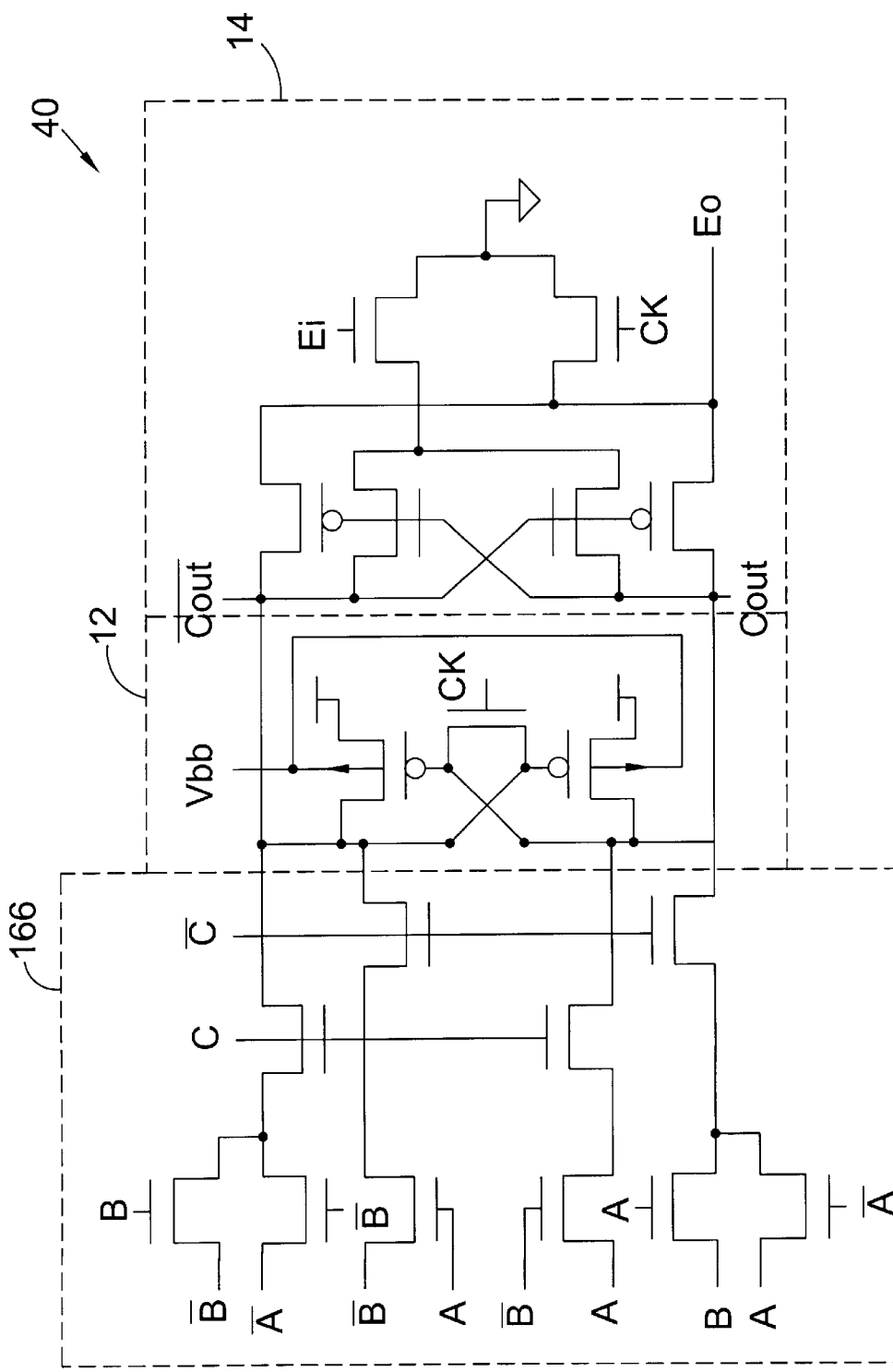

FIGS. 6A and 6B show the schematic diagram of a sum circuit 30 and a carry circuit 40, respectively, of a full adder. Both the sum circuit 30 and the carry circuit 40 include a precharging circuitry 12 and an acceleration buffer 14' or 14. As shown, the logic networks 16a and 16b easily implement the circuitry to implement the sum circuit 30 and carry circuit 40 using nMOS transistors controlled by control and pass variables A, /A, B, /B and carry-in signals C and /C. The output nodes of the CRDL circuit serve as sum out nodes Sout and /Sout and carry out nodes Cout and /Cout. The 8-bit carry chain is constructed by cascading this cell in series, as shown in FIG. 7.

Figure 7A:
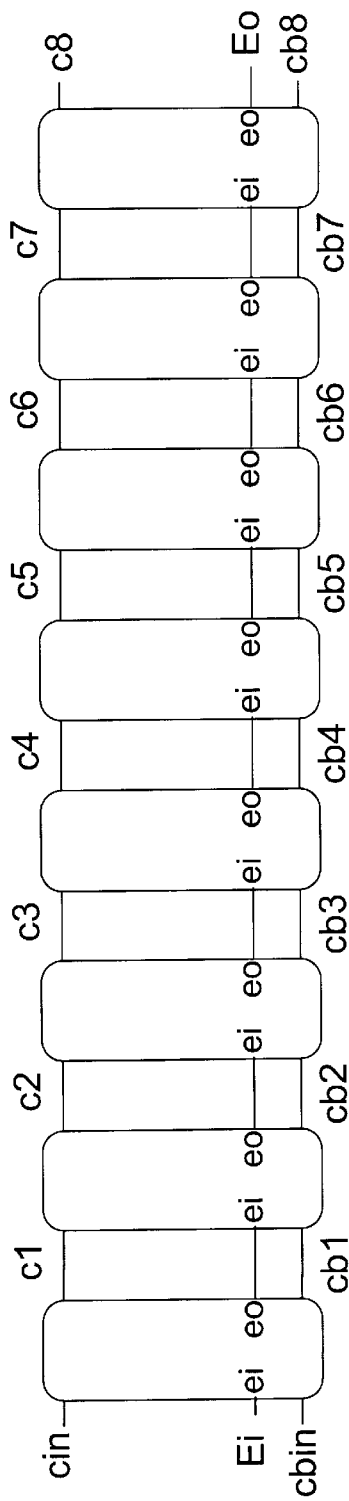
FIGS. 7A and 7B illustrate simple and optimized versions, respectively, of an 8-bit carry chain.
Figure 7B:
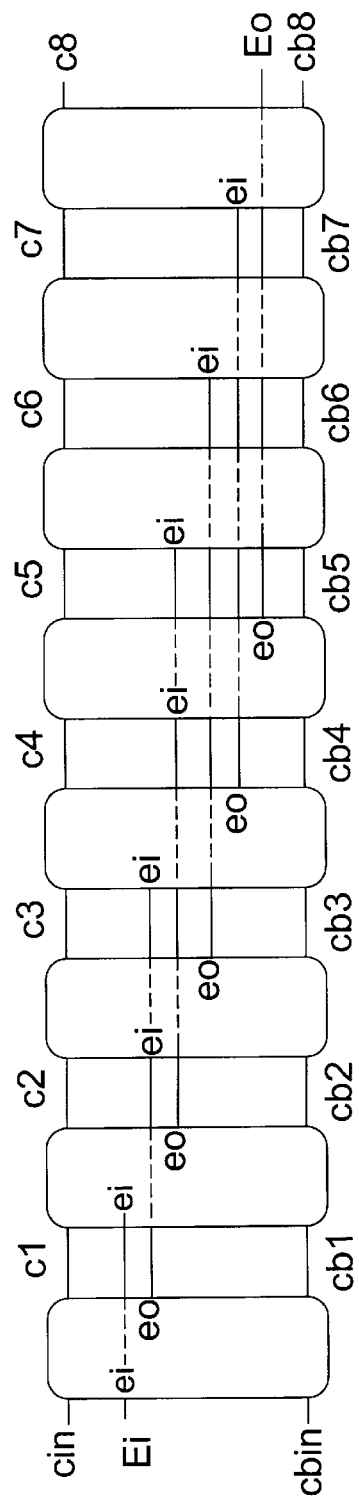

The simple version is shown in FIG. 7A in which the output signal Eo of the previous stage is used as the enable signal Ei. In this case, the CRDL circuit consumes approximately 23% less power with almost the same speed as the conventional one. FIG. 7B shows the improved version where the interconnection of Eo is optimized. In other words, the output signal Eo of each stage is connected up to the next 4th stage to reduce the propagation delay by optimizing the timing for the activation of the buffer amplifier.

With this connection, the speed improves approximately by 35% over the simple version without any additional power consumption.

In the conventional DCVS Manchester carry-chain, carry look-ahead technique is used to speed up the operation. All the precharged dynamic nodes in conventional circuits are made static using a weak pMOS transistor to supply enough current to compensate for the leakage as well as to strengthen these nodes against the external noise. The chip for these circuits was fabricated using the 0.8 $\mu$m single-poly double-metal n-well CMOS process. Because the threshold voltage adjustment was not feasible in this process, those of the cross-coupled pMOS transistors for the CRDL were adjusted by applying back-bias voltage so the precharged value was about 3.5V.

Figure 8A:
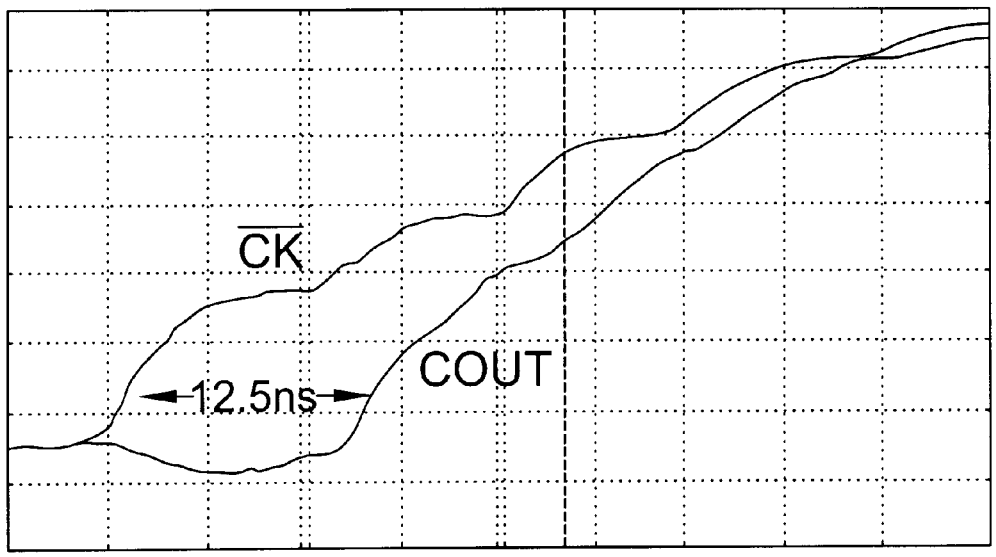
FIGS. 8A and 8B illustrate measured waveforms of an optimized six stage version of an 8-bit Manchester and a 32 stage full adder, respectively, using the CRDL circuit.
Figure 8B:
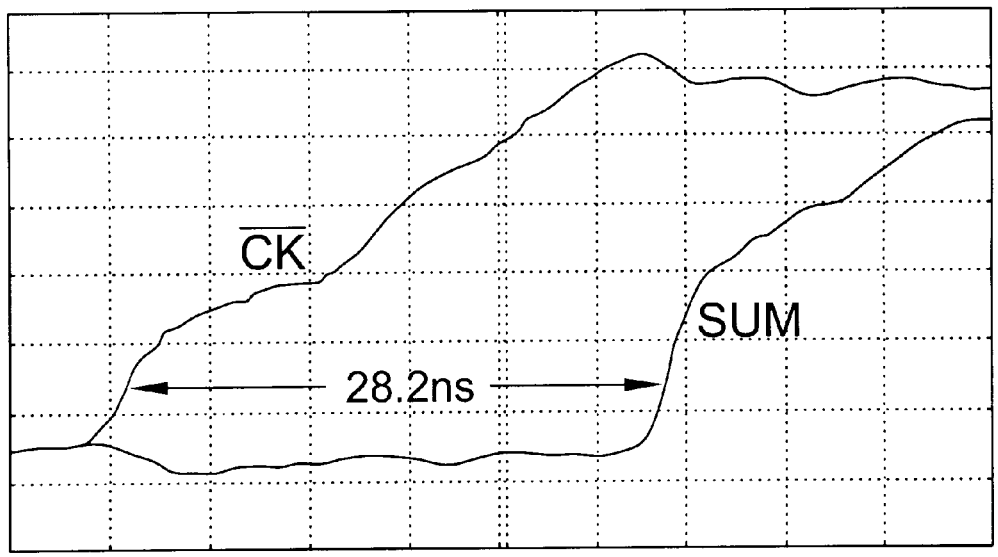

An 8-bit Manchester carry-chains and full adders constructed of CRDL circuit and of DCVS circuit are designed as benchmark circuits to verify the performance of the proposed logic circuit. FIGS. 8A and 8B are the measured waveforms of the optimized Manchester carry-chain and the full adder implemented using CRDL, respectively. There is only a 12.5 nanosecond delay between the clock signal /CK and an output at the carry out node Cout in the Manchester carry-chain, and only a 28.2 nanosecond delay between the clock signal /CK and the output at the sum node.

Based on such measurements, the following Tables I(a) and (b) list the number of transistors, the average power, the worst-case propagation delay, and the calculated power-delay product of each of the logic circuits. The simple and the optimized carry chain with CRDL circuit in accordance with the present invention achieve about 21% and 48% improvements, respectively, in power-delay product over the DCVS circuit, as shown in Table I(a).

TABLE I(a)

|  | Delay (nSec) | Power ($\mu$W@10 MHz) | Power*Delay Product (fJ) |
| --- | --- | --- | --- |
| DCVS | 140 | 3.08 | 142 | 437 |
| CRDL | 128 | 3.17 | 109 | 346 |
| CRDL (opt.) | 128 | 2.08 | 109 | 226 |

The measurement result of full adder, which is shown in Table I(b), indicates that the new circuit improves power-delay product 16% over the conventional circuit.

TABLE I(b)

|  | Device Count | Delay (nSec) | Power ($\mu$W@10 MHz) | Power*Delay Product (fJ) |
| --- | --- | --- | --- | --- |
| DCVS | 38 | 0.70 | 37.5 | 26.3 |
| CRDL | 33 | 0.88 | 25.0 | 22.0 |

To compare the performance with static CMOS logic circuits, the simulation results of static full adders together with that using DCVS and CRDL circuits are shown below in Table II. These simulations are performed at 10 MHz operating frequency including parasitic components extracted from the layout (the switching activities of static adders are around 50%). The result in the table shows that the static logic style has slightly better performance in terms of power delay product.

TABLE II

Result comparison between static and dynamic full adders.

| | Device Count | Delay (nSec) | Power ($\mu$W@10 MHz) | Power*Delay Product (fJ) |
|---|---|---|---|---|
| Static CMOS | 40 | 1.65 | 11.0 | 18.2 |
| Pass-Tr. | 48 | 1.34 | 16.0 | 21.4 |
| DCVS | 38 | 0.75 | 32.4 | 24.3 |
| CRDL | 33 | 0.90 | 22.2 | 20.0 |

The static logic circuits have slower speed, and as a result, precharged circuit techniques are popularly used in high-speed applications due to their speed advantage although they consume larger power than the static logic. Moreover, since almost all of today's challenging low-power systems, such as portable cellular telephone or notebook computers, are simultaneously high-speed systems requiring many of these techniques, it is important to reduce as much power as possible in precharge logic circuits.

Figure 9A:
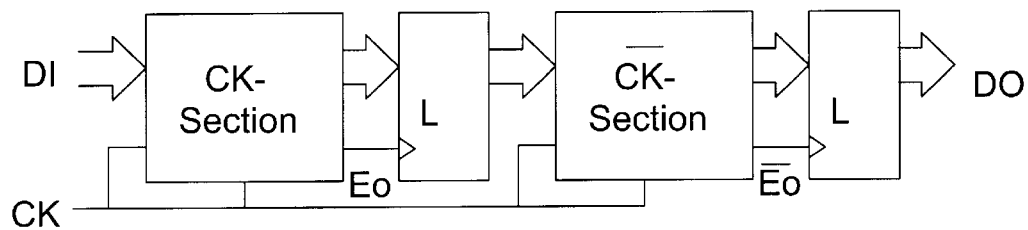
FIGS. 9A–9C illustrate block diagrams and waveform for a circuit having a true single-phase clocking scheme using the CRDL circuit of the present invention.
Figure 9B:
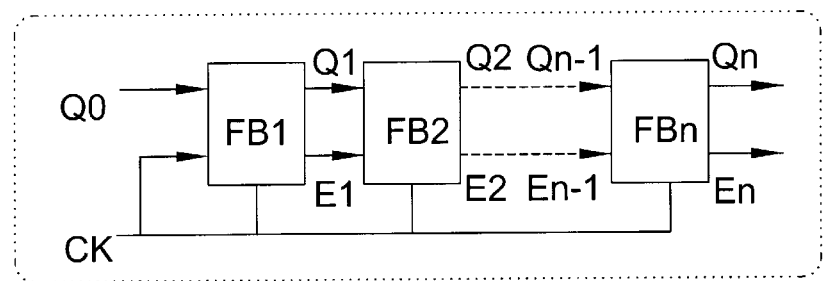
Figure 9C:
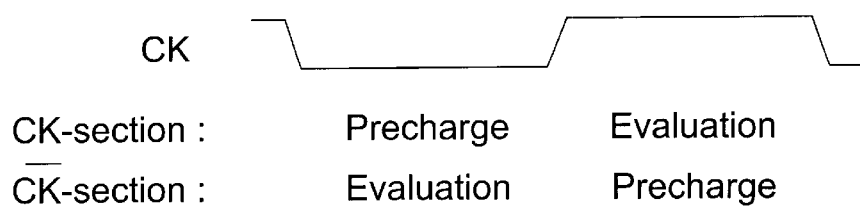

FIGS. 9A and 9B are circuit diagrams of a true single-phase clocking scheme using the CRDL circuit, and FIG. 9C illustrates the timing diagram. The circuit of FIG. 9A includes two pipeline sections, a CK section and a /CK section, i.e., pipeline stages, which are synchronized by a global clock signal CK. The latches are controlled by locally generated enable output signals Eo or /Eo from the previous function blocks of the pipeline section. When the clock signal is low, the CK section precharges the output nodes and the /CK section evaluates the input values. Similarly, the CK and /CK sections are in the evaluation and precharge phases, respectively, when the clock signal is high. See FIG. 9C.

Each of the sections comprises a plurality of function blocks FB1–FBn and each function block is implemented using the corresponding CRDL circuit of FIGS. 2A–2G.

Preferably, the first function block FB1 in the CK section is implemented using the CRDL circuit of FIG. 2F while second and subsequent function blocks FB2–FBn of the CK section are implemented using the CRDL circuit of FIG. 2C. For the /CK section, the first function block FB1 is implemented using the CRDL circuit of FIG. 2G and the second and subsequent function blocks are implemented using the CRDL circuit of FIG. 2A. A true single-phase latch (TSPL) or the swing suppressed input latch (SSIL) described in co-pending application Ser. No. 08/775,951 filed Jan. 3, 1997, commonly assigned to same assignee of the present application and incorporated herein by reference, may be used as the storage element or latch L between the pipeline sections with the clock signals being replaced between the enable output signal Eo or /Eo generated in the last function block of each pipeline section. The same latch structure is used for both pipeline sections as the enable outputs have the same signal transitions.

As compared to the conventional true-single-phase clock circuits, the clocking scheme of the FIG. 9 embodiment has various advantages. As shown in FIGS. 2A, 2C, 2F, and 2G, this circuit eliminates PMOS-logic blocks for logic composition in the pipeline configuration, which leads to a faster operation with a smaller power consumption. Although the TADL uses NMOS-only logic blocks, the speed advantage of NMOS transistors is not fully exploited. On the contrary, the FIG. 9 circuit uses NMOS devices only for pull-down in both the pipeline sections. Pull-up transitions are generally done with the cross-coupled pair. Therefore, the circuit can operate at the highest achievable speed using NMOS-logic block. Moreover, unlike the TADL, multiple function blocks can be located in a pipeline section, increasing logic flexibility. Moreover, the circuit with the novel clocking scheme shares the advantages of CRDL technique, such as reduced power consumption, decreased di/dt noise, and inherently static operation.

Figure 10B:
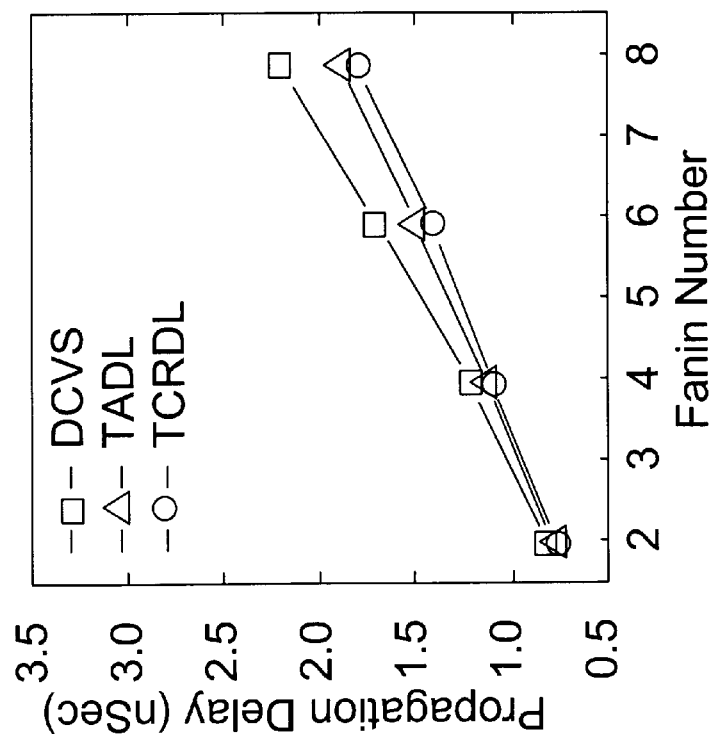
FIGS. 10A–10D illustrate comparions results of XOR/XNOR gates using the CRDL, DCVS, and TADL circuits.
Figure 10A:
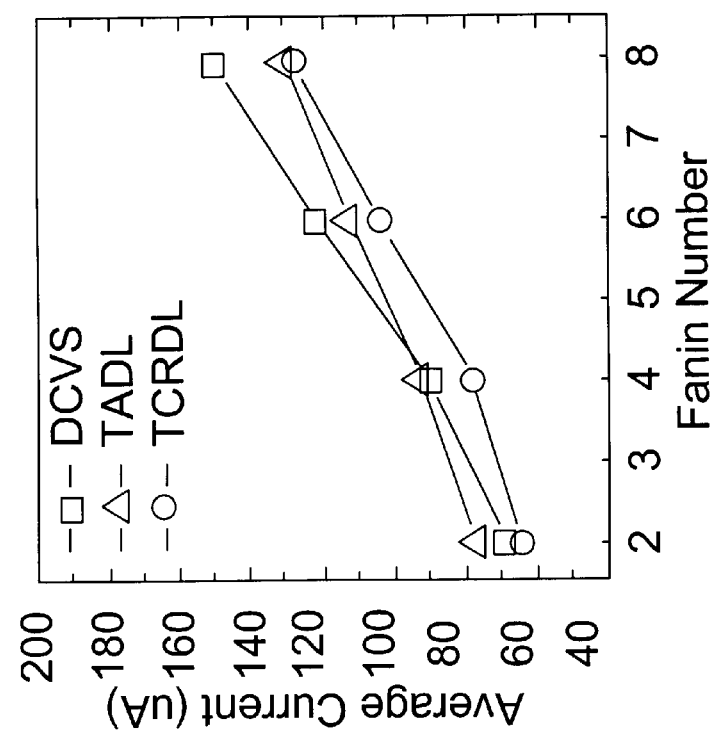
Figure 10D:
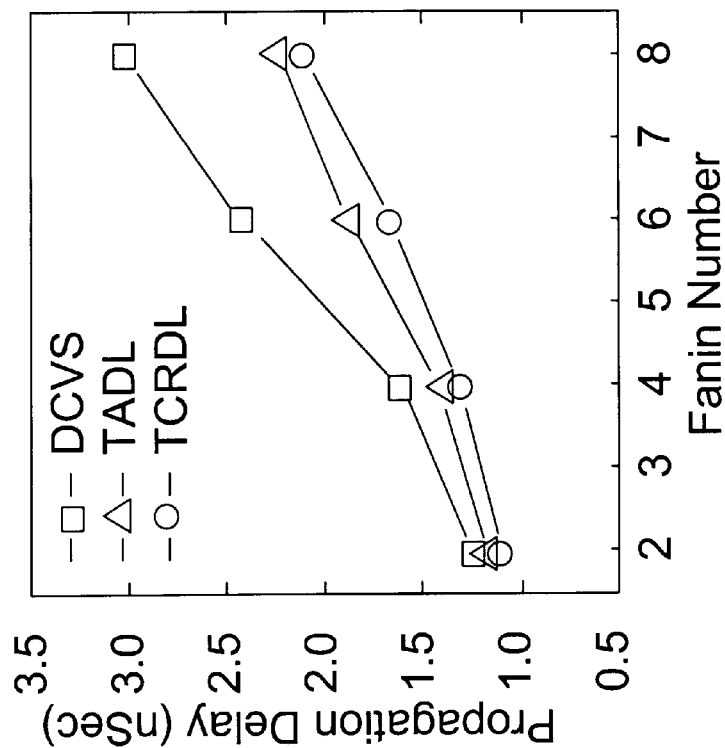
Figure 10C:
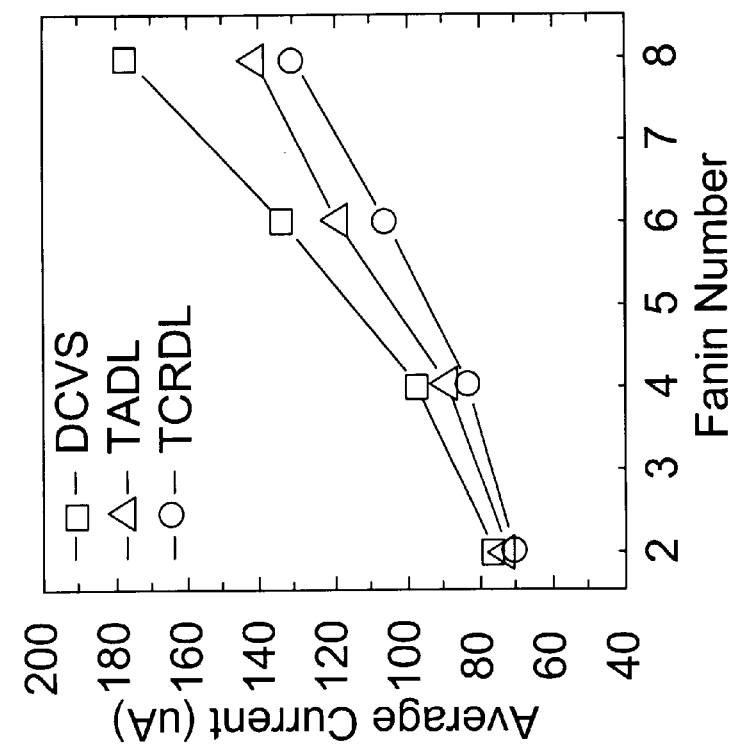

To compare the performance of the present circuit technique to the conventional circuits, multi-input XOR/XNOR gates are designed with the CRDL, DCVS, and TADL circuits. Current consumption and propagation delays of these gates with the load capacitance of 100 fF and the fanin number was changed from 2 to 8, and the results are plotted in FIGS. 10A–10D. These results were derived using a 0.8 $\mu$m n-well single-poly double-metal CMOS process using a power supply of 5V. FIGS. 10A and 10B compare CK section of DCVS and TADL with /CK-section of TCRDL, while FIGS. 10C and 10D are for /CK-section of conventional circuits and CK-section of the new circuit. As shown in these figures, the present circuit technique is more advantageous in terms of power and speed for entire range of fanin number.

Figure 11:
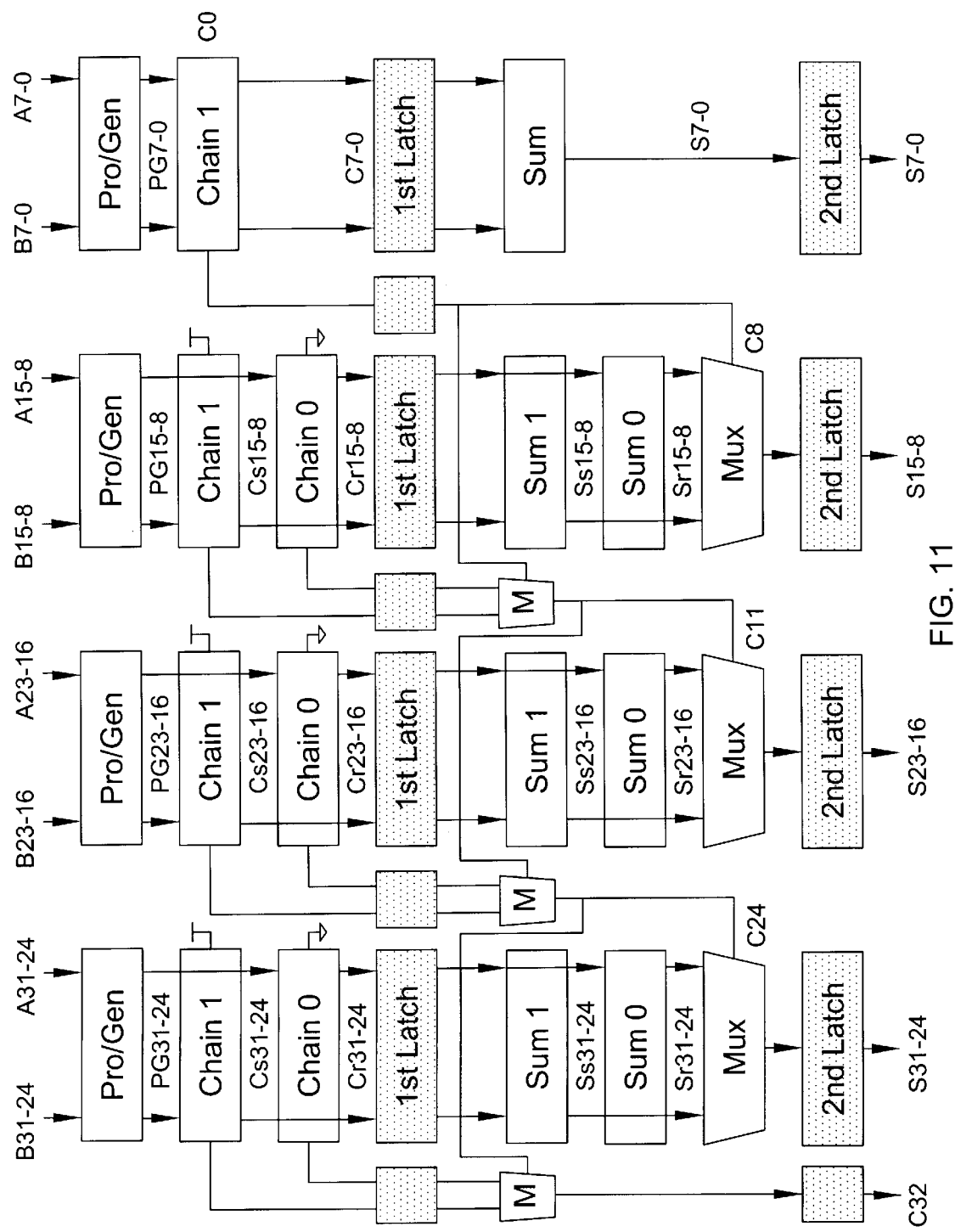
FIG. 11 illustrates a block diagram of a pipelined 32-bit adder.

To apply the CRDL to more complex VLSI system, 2-stage pipelined 32-bit adders with the conventional and the proposed circuit techniques were compared. The block diagram of the adder is shown in FIG. 11 which is divided into four 8-bit subsections. The carry selection scheme is used for high speed operation.

Each 8-bit subsection consists of four types of basic blocks. The first block is to produce 8-bit propagate and generate terms from the input data and corresponds to the /CK section of FIG. 9A. The next block is the carry chain which produces 8 bit carry terms, and corresponds to the CK section. As the carry selection scheme is used, there are two carry chain blocks. One with 'set' carry input, the other with 'reset' carry-in. A Manchester carry-chain is used for carry propagation.

In the DCVS adder, the carry-lookahead technique is used for high-speed operation. Sum generation block also generates two sum values per bit, respectively for 'set' and 'reset' carries. When an actual input carry propagates, the proper sum and carry values are selected in the multiplexer block. For a 2-stage pipelined operation, two latch stages are inserted as shown in FIG. 11. In the CRDL adder, the first pipeline stage is implemented as the /CK-section. Meanwhile, the DCVS adder uses n-type logic (CK-section) as the first pipline stage. This design change is to optimize the carry-chain block in terms of speed using faster logic block of each logic style.

The average power and the worst-case propagation delay of the adders are shown in Table III. Each pipeline stage can operate at the frequency up to around 690 MHz. As shown in the table, the power-delay product of the CRDL circuit for the first pipeline stage is improved by as much as 30.1% as compared to DCVS pipeline stage. In case of the second stage, the percent improvement is about 49.8% far exceeding that for the first stage. This attributes to the NMOS-only implementation of logic trees in CRDL adder.

TABLE III

The results for the pipelined 32-bit adders.

|  | Logic Type | Delay (nS) | Power (mW) | P*D (fJ) |
|---|---|---|---|---|
| 1st pipeline stage | DCVS | 1.47 | 21.9 | 32.2 |
|  | TCRDL | 1.46 | 15.4 | 22.5 |
| 2nd pipeline stage | DCVS | 1.45 | 20.9 | 30.3 |
|  | TCRDL | 1.45 | 10.5 | 15.2 |

In this case, the CRDL adder was designed to have similar delay as the DCVS adder to observe the improvement in power consumption. However, the CRDL circuit can be designed with similar power consumption as the DCVS adder to observe the improvement in the delay. As can be appreciated, the delay and power consumption provides a trade off during design considerations.

As described above, a novel logic circuit, called a CRDL circuit, and the devices using the same are disclosed above to meet the demands of current low-power high-speed VLSI systems. The CRDL circuit improves power efficiency by utilizing a charge recycling technique with comparable speed of the conventional precharged circuit. Due to inherently static operation, the noise margin is improved and the problems related to dynamic nodes are eliminated. Further, the CRDL circuit has less ground bouncing noise since the CRDL circuit recycles the internal charge. Moreover, the CRDL circuit has a smaller voltage swing as compared with the conventional precharge logic circuits. The CRDL circuit also allows a true single-phase clocking scheme.

The foregoing embodiments are merely exemplary and are not to be construed as limiting the present invention. The present teaching can be readily applied to other types of logic cells and devices. One of ordinary skill in the art can use the teachings of the present invention to provide other devices requiring reduced power consumption and high operational speed. The description of the present invention is intended to be illustrative, and not to limit the scope of the claims. Many alternatives, modifications, and variations will be apparent to those skilled in the art.

What is claimed is:

1. A circuit operating under a true-single phase clock signal of first and second levels, comprising:
  a plurality of pipelined stages to perform an arithmetic function, each pipelined stage preforming a prescribed function and having a plurality of function blocks to implement the prescribed function, each of the function blocks having a logic circuit including:
   a) first and second nodes;
   b) means for pulling-up said first node to a first potential when the clock signal transits from the first level to said second level;
   c) means for pulling-down said second node to a second potential when the clock signal transits from the first level to the second level; and
   d) means for equalizing said first and second nodes to a third potential between said first and second potentials when the clock signal transits from the second level to the first level.

2. The circuit of claim 1, wherein said pull-down means is a passive transistor logic network for implementing a predetermined logic function.

3. The circuit of claim 1, wherein said pull-down means is a cascode logic network for implementing a predetermined logic function.

4. The circuit of claim 1, wherein said third potential is about one half of a potential difference between said first and second potentials.

5. The circuit of claim 1, further comprising means for providing a potential swing between said first and second potentials in response to a potential swing from said third potential to one of said first and second potential.

6. The circuit of claim 1, further comprising at least one of
  a sense amplifier to accelerate a potential pull-down transition of said first and second nodes; and
  means for generating an output signal.

7. The circuit of claim 6, wherein at least one of said sense amplifier and said generating means comprise fourth, fifth and sixth transistors, said fourth transistor being coupled to said first and second nodes, said fifth transistor being coupled to said first and second nodes, and said sixth transistor being coupled to said fourth and fifth transistors and receiving one of an enable signal and the clock signal.

8. The circuit of claim 7, wherein first and control electrodes of said fourth transistor are coupled to said first and second nodes, respectively, first and control electrodes of said fifth transistor are coupled said second and first nodes, respectively, and second electrodes of said fourth and fifth transistors are commonly coupled to a first electrode of said sixth transistor.

9. The circuit of claim 8, wherein a control electrode of said sixth transistor receives one of the enable signal and the clock signal and a second electrode of said sixth transistor is coupled to a predetermined second potential.

10. The circuit of claim 9, wherein said fourth, fifth, and sixth transistors are nMOS transistors.

11. The circuit of claim 9, wherein said fourth and fifth transistors are pMOS transistors and said sixth transistor is an nMOS transistor.

12. The circuit of claim 1, wherein said pulling-up means comprises a pair of cross-coupled transistors.

13. The circuit of claim 12, wherein said pair of cross-coupled transistor comprises:
  a first transistor having a control electrode and first and second electrodes;
  a second transistor having a control electrode and first and second electrodes, wherein
   said first electrodes of said first and second transistors receive a first predetermined source potential, said control electrode of said first transistor being coupled to said equalizing means and said second node, and said control electrode of said second transistor is coupled to said equalizing means and said first node.

14. The circuit of claim 13, wherein said equalizing means is a third transistor having a control electrode and first and second electrodes, said control electrode receiving the clock signal and said first and second electrodes coupled to said first and second transistors, respectively.

15. The circuit of claim 13, wherein each of said first and second transistors has a threshold voltage higher than said third potential.

16. The circuit of claim 15, wherein said first and second transistors are pMOS transistors.

17. The circuit of claim 14, wherein said third transistor is an nMOS transistor.

18. A circuit operating under a true-single phase clock signal of first and second levels, comprising:
  a plurality of pipelined stages to perform an arithmetic function, each pipelined stage preforming a prescribed function and having a plurality of function blocks to implement the prescribed function, each of the function blocks having a logic circuit including:

(a) first and second nodes;
(b) a pair of cross-coupled first and second transistors coupled to said first and second output nodes;
(c) a third transistor coupled to said first and second transistors, said third transistor equalizing said first and second nodes to potentials which are about equal to one another; and
(d) a logic network coupled to said first and second nodes for implementing a predetermined logic function.

19. The circuit of claim 18, wherein each of said first, second and third transistors includes a first electrode for receiving a first predetermined source potential, a second electrode and a control electrode, said control electrodes of said first and second transistors coupled to said first and second electrodes, respectively, of said third transistor and said control electrodes of said first and second transistors coupled to said second and first nodes, respectively, and second electrodes of said first and second transistors coupled to said first and second nodes, respectively.

20. The circuit of claim 18, wherein said logic network is an nMOS passive transistor logic network.

21. The circuit of claim 18, wherein said logic network is an nMOS cascode logic network.

22. The circuit of claim 18, wherein each of said first and second transistors has a threshold voltage higher than said potential of said first and second nodes which has been equalized by said third transistor.

23. The circuit of claim 18, wherein said first and second transistors are pMOS transistors, and said third transistor is an nMOS transistor.

24. The circuit of claim 18, further comprising at least one of a sense amplifier to accelerate a potential pull-down transition of said first and second nodes; and means for generating an output signal.

25. The circuit of claim 24, wherein at least one of said sense amplifier and said generating means comprise fourth, fifth and sixth transistors, said fourth transistor being coupled to said first and second nodes, said fifth transistor being coupled to said first and second nodes, and said sixth transistor being coupled to said fourth and fifth transistors and receiving one of an enable signal and an clock signal.

26. The circuit of claim 25, wherein first and control electrodes of said fourth transistor are coupled to said first and second nodes, respectively, first and control electrodes of said fifth transistor are coupled said second and first nodes, respectively, and second electrodes of said fourth and fifth transistors are commonly coupled to a first electrode of said sixth transistor.

27. The circuit of claim 26, wherein a control electrode of said sixth transistor receives one of the enable signal and the clock signal and a second electrode of said sixth transistor is coupled to a predetermined second potential.

28. The circuit of claim 27, wherein said fourth, fifth and sixth transistors are nMOS transistors.

29. The circuit of claim 27, wherein said fourth and fifth transistors are pMOS transistors and said sixth transistor is an nMOS transistor.

* * * * *